United States Patent [19]
Sato et al.

[11] Patent Number: 5,302,877
[45] Date of Patent: Apr. 12, 1994

[54] SURFACE ACOUSTIC WAVE DEVICE

[75] Inventors: Takahiro Sato; Hidenori Abe, both of Toda, Japan

[73] Assignee: Nikko Kyodo Co. Ltd., Tokyo, Japan

[21] Appl. No.: 29,514

[22] Filed: Mar. 11, 1993

[30] Foreign Application Priority Data

Mar. 16, 1992 [JP] Japan ................................ 4-58306
Feb. 4, 1993 [JP] Japan ................................ 5-17663

[51] Int. Cl.$^5$ ............................................ H01L 41/08
[52] U.S. Cl. ............................. 310/313 A; 310/313 R
[58] Field of Search ............... 310/313 A, 313 R, 360; 333/154, 193

[56] References Cited

U.S. PATENT DOCUMENTS

| | | | |
|---|---|---|---|
| 4,489,250 | 12/1984 | Ebata et al. | 310/313 A |
| 4,523,119 | 6/1985 | Whatmore et al. | 310/313 A |
| 4,634,913 | 1/1987 | Whatmore et al. | 310/313 A |
| 4,672,255 | 1/1987 | Suzuki et al. | 310/313 A |
| 4,868,444 | 9/1989 | Shibata et al. | 310/313 A |

FOREIGN PATENT DOCUMENTS

60-259011 12/1985 Japan.
2-44169 10/1990 Japan.
5-7124 1/1993 Japan.

OTHER PUBLICATIONS

"Characteristics of Leaky Surface Waves Propagating on Li2B4O7", IEEE 1989 Ultrasonics Symposium, M. Murota, et al., pp. 291-294, 1989.

"Temperature Compensated Piezoelectric Lithium Tetraborate Crystal for High Frequency Surface Acoustic Wave and Bulk Wave Device Applications", IEEE 1985 Ultrasonics Symposium, 1985.

*Primary Examiner*—Mark O. Budd
*Attorney, Agent, or Firm*—Dickstein Shapiro & Morin

[57] ABSTRACT

A surface acoustic wave device comprises lithium tetraborate single crystal substrate to make use of surface acoustic waves with higher propagation velocities and smaller propagation losses, whereby frequencies to be signal-processed can be as high as above 1 GHz. The surface acoustic wave device comprises a metal film formed on a surface of a lithium tetraborate single crystal substrate, the metal film being for exciting, receiving, reflecting and/or propagating surface acoustic waves, the metal film being so formed that a cut angle of the substrate, and a propagation direction of the surface acoustic waves are in an Eulerian angle representation of (39°-51°, 66°-114°, −20°-20°) and directions equivalent thereto. In this propagation direction few Rayleigh waves exit, and only surface acoustic waves of high propagation velocity are generated. Propagation losses can be eliminated.

20 Claims, 32 Drawing Sheets and# SURFACE ACOUSTIC WAVE DEVICE

BACKGROUND OF THE INVENTION

The present invention relates to a surface acoustic wave device using lithium tetraborate single crystal ($Li_2B_4O_7$).

The surface acoustic wave device is a circuit element for processing signals by converting an electric signal to a surface wave, and is used in filters, delay lines, etc. Usually the surface acoustic wave device comprises a metal electrode which is the so-called interdigital transducer (IDT) disposed on a piezoelectric elastic substrate (piezoelectric substrate), whereby an electric signal is converted and reconverted into and from a surface wave. The surface acoustic wave device mainly uses, as the surface acoustic wave, surface acoustic waves called Rayleigh waves which propagate over elastic surfaces without losses.

Materials of the substrate of the surface acoustic wave device are quartz, lithium tantalate ($LiTaO_3$), etc. Quartz has good temperature stability but poor piezoelectricity. Lithium tantalate has good piezoelectricity but poor temperature stability. Recently lithium tetraborate single crystal has been noted as a material satisfactorily having these properties (e.g., Japanese Patent Publication No. 44169/1990 and Japanese Patent Publication No. 40044/1988).

But the surface acoustic wave device using lithium tetraborate has found it difficult to process higher frequencies of signals.

A width of the finger electrodes of an interdigital transducer (IDT) and a gap between the respective finger electrodes and their adjacent ones are set at ¼ of a wave length of a surface acoustic wave corresponding to a signal frequency to be normally processed ($\lambda/4$). But the propagation velocity of Rayleigh waves over lithium tetraborate single crystal is about 3400 m/sec, and for the processing of signal frequencies above 1 GHz, the finger electrode width and electrode gap must be below 1 μm. Accordingly fabrication yields of the interdigital transducer lower, which makes the fabrication of the surface acoustic wave device very difficult.

But the fabrication of the interdigital transducer is facilitated by raising an acoustic velocity (propagation velocity) of the surface acoustic waves to thereby allow the finger electrode width and the gap between the finger electrodes to be increased. It is proposed to use, as the surface acoustic waves, leaky surface acoustic waves, the so-called leaky waves, which propagate, radiating a part of their energy in the direction of depth of an elastic substrate. Generally leaky waves have too large propagation losses to be used in surface acoustic wave devices. But their propagation losses can be reduced depending on specific cut angles or propagation directions, and leaky waves can be used. For example, 36° Y-X lithium tantalate is proposed.

SUMMARY OF THE INVENTION

An object of the present invention is to provide a surface acoustic wave device which includes a substrate of lithium tetraborate single crystal to make use of surface acoustic waves with high propagation velocity and small propagation losses, whereby signal processing of high frequencies above 1 GHz is enabled.

The above-described object can be achieved by a surface acoustic wave device comprising a metal film formed on the surface of a lithium tetraborate single crystal substrate, the metal film being for exciting, receiving, reflecting and/or propagating surface acoustic waves, the metal film being so formed that a cut angle of the substrate, and a propagation direction of the surface acoustic waves are in an Eulerian angle representation of (39°–51°, 66°–114°, −20°–20°) and directions equivalent thereto.

In the surface acoustic wave device according to the present invention, it is preferable that the metal film is formed of a metal comprising gold as a main component, that the metal film has a normalized film thickness of 0.01–4.5%, and that the metal film is so formed that a cut angle of the substrate, and a propagation direction of the surface acoustic waves are in an Eulerian angle representation of (0°–45°, 82°–98°, −2°–2°) and directions equivalent thereto.

In the surface acoustic wave device according to the present invention, it is preferable that the metal film is formed of a metal comprising aluminium as a main component, that the metal film has a normalized film thickness of 0.1–35%, and that the metal film is so formed that a cut angle of the substrate, and a propagation direction of the surface acoustic wave are in an Eulerian angle representation of (0°–45°, 82°–98°, −2°–2°) and direction equivalent thereto.

In the surface acoustic wave according to the present invention, it is preferable that the metal film is so formed that a cut angle of the substrate, and the propagation direction of the surface acoustic wave are in an Eulerian angle of (44°–46°, 89°–91°, −1°–1°) and direction equivalent thereto.

Further, in the surface acoustic wave according to the present invention, it is preferable that an insulating film is formed on the lithium tetraborate single crystal substrate and the metal film.

Furthermore, in the surface acoustic wave device according to the present invention, it is preferable that the insulating film is formed of silicon dioxide.

Still furthermore, in the surface acoustic wave according to the present invention, it is preferable that the insulating film has a normalized film thickness of 1–35%.

In the surface acoustic wave device according to the present invention, a metal film is so formed that a cut angle of the substrate and a propagation angle of the surface acoustic wave are in a specific direction. Accordingly surface acoustic waves of SH (Horizontal Shear) wave-type can be used on the surface acoustic wave substrate. The surface acoustic wave of the SH wave-type has high propagation velocities, small propagation losses and high electromechanical coupling factors. Little rayleigh waves generate in the angle range according to the present invention, and spurious emission is low. The propagation loss can be eliminated by setting the cut angle of the substrate and the propagation direction of the surface acoustic wave in an Eulerian angle representation of (39°–51°, 66°–114°, −20°–20°) and the directions equivalent thereto.

It is known (G. Koerber et al., "Generalized Bleustein Modes", IEEE Transaction on Sonics and Ultrasonics, vol. SU-19, No. 1, January 1972) that if a point symmetry 4 mm piezoelectric substrate, such as a lithium tetraborate single crystal substrate, has a surface parallel with the fourfold axis, surface acoustic waves of Bleustein modes exit in a direction normal to the fourfold axis.

In the surface acoustic wave device according to the present invention, the metal film is formed of a metal on a surface of a lithium tetraborate single crystal substrate and the cut angle of the substrate and the propagation direction of the surface acoustic wave are in an Eulerian representation of (39°-51°, 66°-114°, −20°-20°) and in the directions equivalent thereto, whereby a surface acoustic wave device having higher electromechanical coupling factors, higher phase velocities and no propagation losses can be realized.

Furthermore, in the surface acoustic wave device according to the present invention, the metal film is formed of a metal comprising gold as the main component, the normalized film thickness of the metal film of 0.01-4.5%, and the cut angle of the substrate and the propagation direction of the surface acoustic wave are in an Eulerian representation of (0°-45°, 82°-98°, −2°-2°) and in the directions equivalent thereto, whereby a surface acoustic wave device having higher electromechanical coupling factors, higher phase velocities and smaller propagation losses can be realized. With the metal film having a normalized film thickness of 0.2-1.5%, a surface acoustic wave device having better electromechanical coupling factors can be realized.

Furthermore, in the surface acoustic wave device according to the present invention, the metal film is formed of a metal comprising aluminium as the main component, the normalized film thickness of the metal film is 0.1-35%, and the cut angle of the substrate and the propagation direction of the surface acoustic wave are in an Eulerian angle representation of (0°-45°, 82°-98°, −2°-2°) and in the direction equivalent thereto, whereby a surface acoustic wave device having higher electromechanical coupling factors, higher phase velocities and smaller propagation losses can be realized. With the metal film having a normalized film thickness of 2-15%, a surface acoustic wave device having better electromechanical coupling factors can be realized.

Furthermore, in the surface acoustic wave device according to the present invention, the metal film is so formed that the cut angle of the substrate and the propagation direction of the surface acoustic wave are in an Eulerian angle representation of (44°-46°, 89°-91°, −1°-1°) and the directions equivalent thereto, whereby a surface acoustic wave device having higher electromechanical coupling factors, higher phase velocities and no propagation losses can be realized. In addition, the reproducibility of the substrate is good, and the fabrication of the substrate is easy.

Furthermore, in the surface acoustic wave device according to the present invention, an insulating film is formed on the lithium tetraborate single crystal substrate and the metal film, whereby a surface acoustic wave device having higher electromechanical coupling factors, high phase velocities, and smaller propagation losses can be realized.

Furthermore, in the surface acoustic wave device according to the present invention, the insulating film formed on the lithium tetraborate single crystal substrate is formed of silicon dioxide, whereby the surface acoustic wave device can have improved temperature characteristics.

DETAILED DESCRIPTION OF THE INVENTION

1. Results of Simulations

Various numerical simulations were conducted for characteristics of the surface acoustic wave (hereinafter called "the present SAW") of the surface acoustic wave device according to the present invention comprising a metal film formed on the surface of a substrate of lithium tetraborate ($Li_2B_4O_7$) single crystal. Before examples of the present invention are explained, the method of the simulations, and the simulation results will be explained. Lithium tetraborate single crystal has the symmetry of point group 4 mm, and the characteristics of the surface acoustic wave have a set symmetry. In the following description, a direction includes equivalent directions belonging to the symmetry. The simulations were conducted at the room temperature (20° C. or 25° C.).

Figure 32:
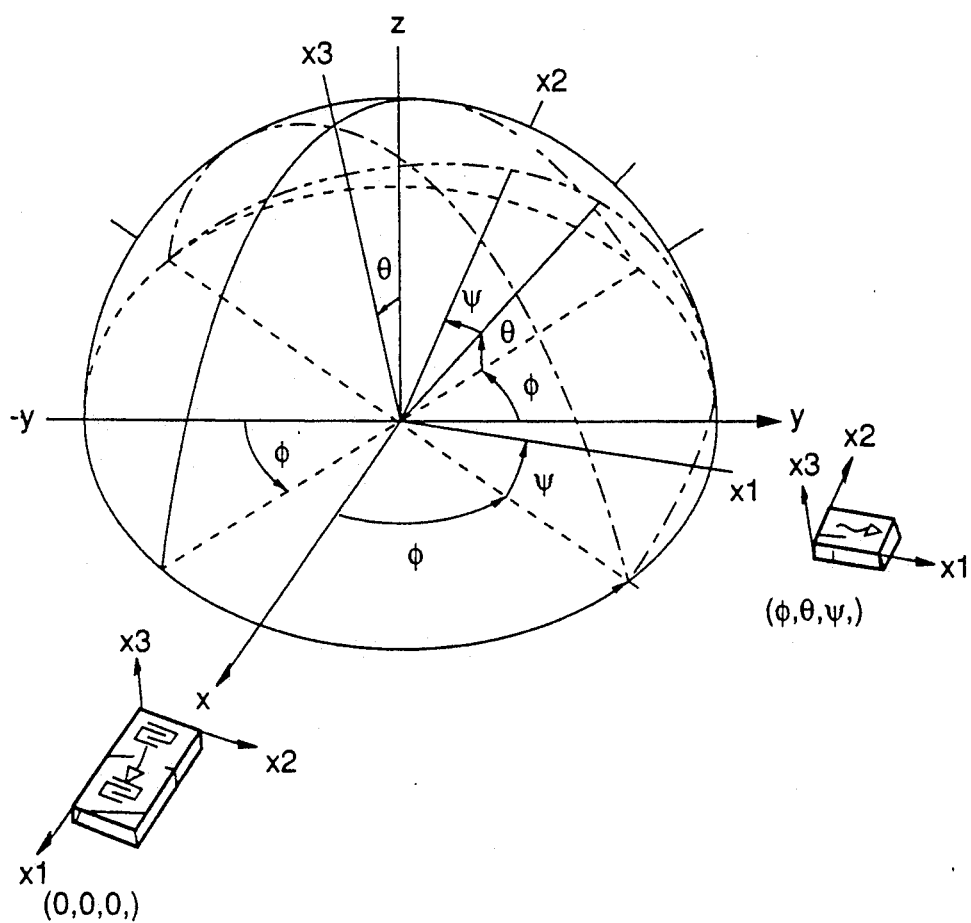
FIG. 32 is a view explanatory of the Eulerian angle representation.

An Eulerian angle representation ($\phi$, $\theta$, $\psi$) will be explained with reference to FIG. 32. $X_1$ represents a propagation direction of an surface acoustic wave; $X_2$, a direction perpendicular to the propagation direction $X_1$ of the surface acoustic wave, which is included in a piezoelectric substrate; and $X_3$, a direction perpendicular to $X_1$ and $X_2$. A reference Eulerian angle (0°, 0°, 0°) is obtained when the $X_1$, $X_2$, and $X_3$ are respectively crystallographic axes X, Y, and Z (or crystallographic axes a, b, and c). First, the propagation direction $X_1$ of the surface acoustic wave is rotated on the $X_3$ direction by the angle $\phi$ from the X-axis toward the Y-axis. Then the direction $X_3$, which is perpendicular to the substrate surface, is rotated by the angle $\theta$ counter-clockwise from the Z-axis on the rotated $X_1$ direction. Next the propagation direction $X_1$ is again rotated by the angle $\psi$ counter-clockwise on the rotated $X_3$ direction in plane of the substrate surface. The thus-obtained direction (a propagation direction of a surface acoustic wave including a cut angle (cut surface) of the substrate) is represented by an Eulerian angle $(\phi, \theta, \psi)$.

1.1 Results of Simulations in which a Propagation Direction of the Surface Acoustic Wave is Changed A metal film (normalized film thickness: $h/\lambda = 1.0\%$) of a metal comprising aluminium as the main component was formed on the surface of the substrate of lithium tetraborate single crystal. Characteristics of the surface acoustic wave were simulated when the respective angles of a direction of the surface acoustic wave represented in an Eulerian angle $(\phi, \theta, \psi)$ are changed. The simulation results will be explained with reference to FIGS. 1 to 12.

1.1.1 In the Simulation in which the Angles $\phi$, $\psi$ of a Propagation Direction $(\phi, 90°, \psi)$ of the Surface Acoustic Wave are Changed The results of the simulation in which when the propagation direction of the present SAW was in an Eulerian angle representation $(\phi, 90°, \psi)$, the angles $\phi$ and $\psi$ were changed will be explained.

Figure 1:
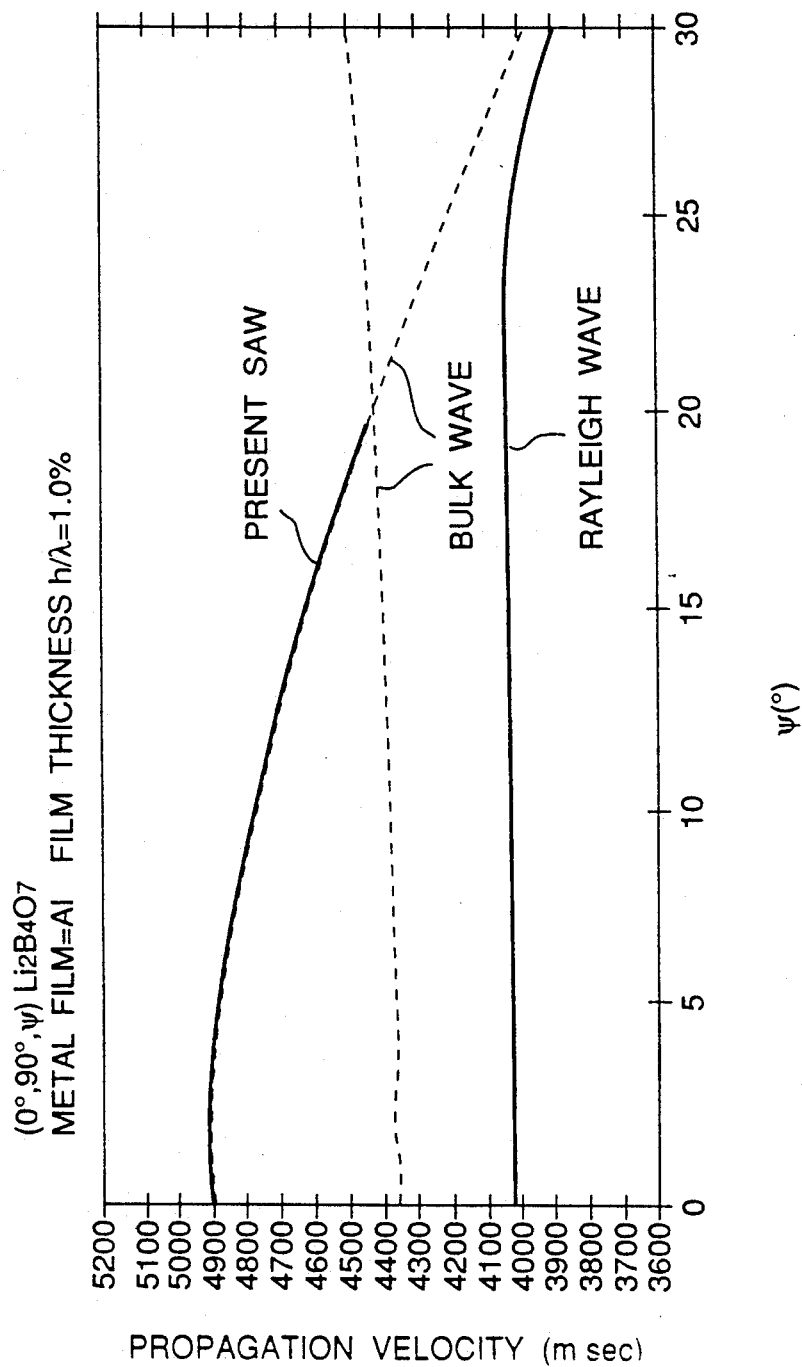
FIG. 1 is a graph of the result of the simulation on the propagation velocity in the surface acoustic wave device including on a lithium tetraborate single crystal substrate a metal film comprising aluminium as the main component, in which the angle $\psi$ of a propagation direction (0°, 90°, $\psi$) is varied.
Figure 2:
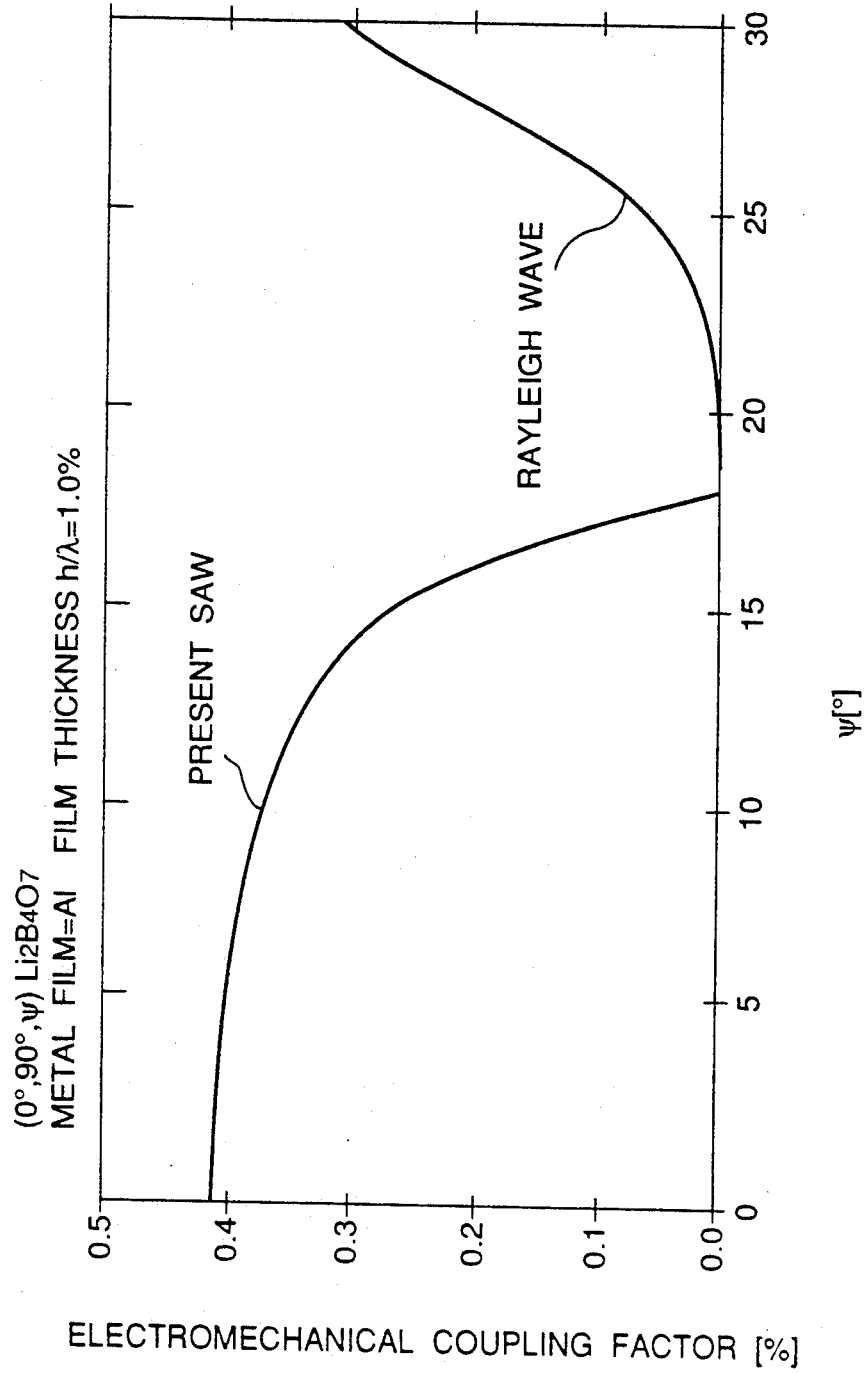
FIG. 2 is a graph of the result of the simulation on the electromechanical coupling factor in the surface acoustic wave device including on a lithium tetraborate single crystal substrate a metal film comprising aluminium as the main component, in which the angle $\psi$ of a propagation direction (0°, 90°, $\psi$) is varied.
Figure 3:
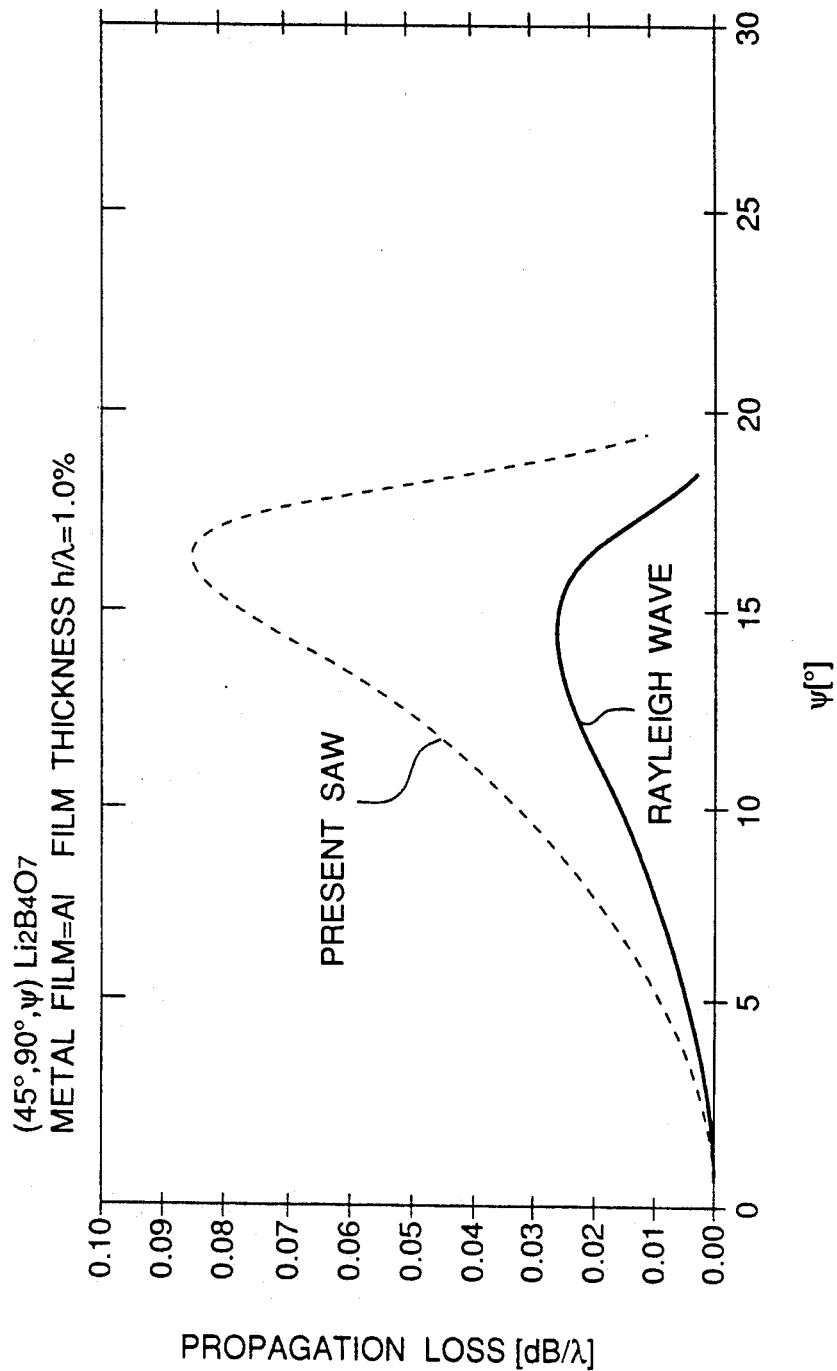
FIG. 3 is a graph of the result of the simulation on the propagation loss in the surface acoustic wave device including on a lithium tetraborate single crystal substrate a metal film comprising aluminium as the main component, in which the angle $\psi$ of a propagation direction (0°, 90°, $\psi$) is varied.

FIGS. 1 to 3 show the results of the simulation in which when the propagation direction of the surface acoustic wave was represented by $(0°, 90°, \psi)$, the propagation velocity [m/sec], the electromechanical coupling factor [%] and the propagation loss [dB/$\lambda$] were simulated with the angle $\psi$ changed.

As shown in FIG. 2, the present SAW exists in an angle $\psi$ range of 0°–18°. The range of the angle $\psi$ belonging to the symmetry is $-18°$–18°. As shown in FIG. 1, the propagation velocity of the present SAW is about 4400–4900 m/sec which is higher than Rayleigh waves. As shown in FIG. 3, the propagation loss of the present SAW is below 0.02 dB/$\lambda$ in an angle $\psi$ range of 0°–8°.

Figure 4:
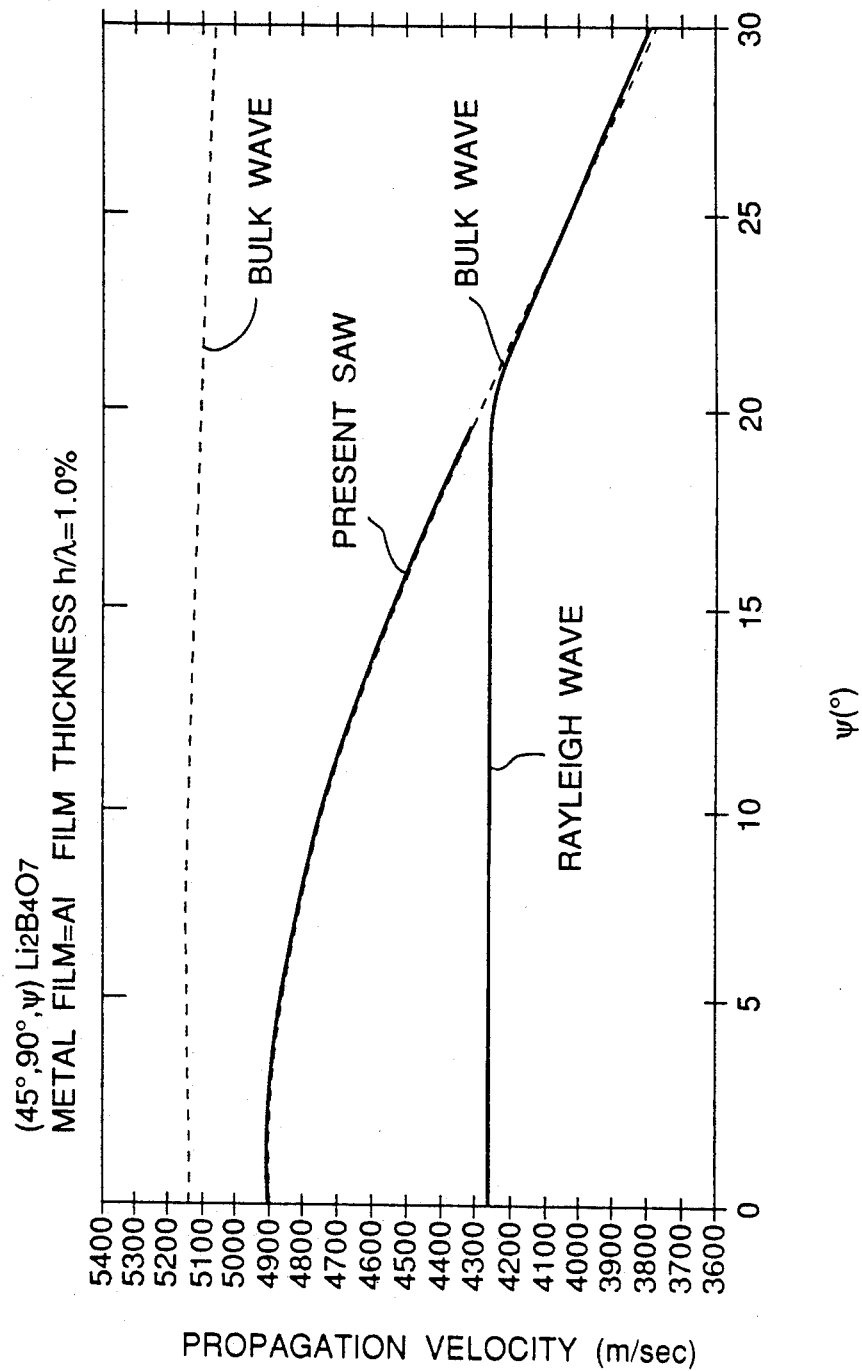
FIG. 4 is a graph of the result of the simulation on the propagation velocity in the surface acoustic wave device including on a lithium tetraborate single crystal substrate a metal film comprising aluminium as the main component, in which the angle $\psi$ of a propagation direction (45°, 90°, $\psi$) is varied.
Figure 5:
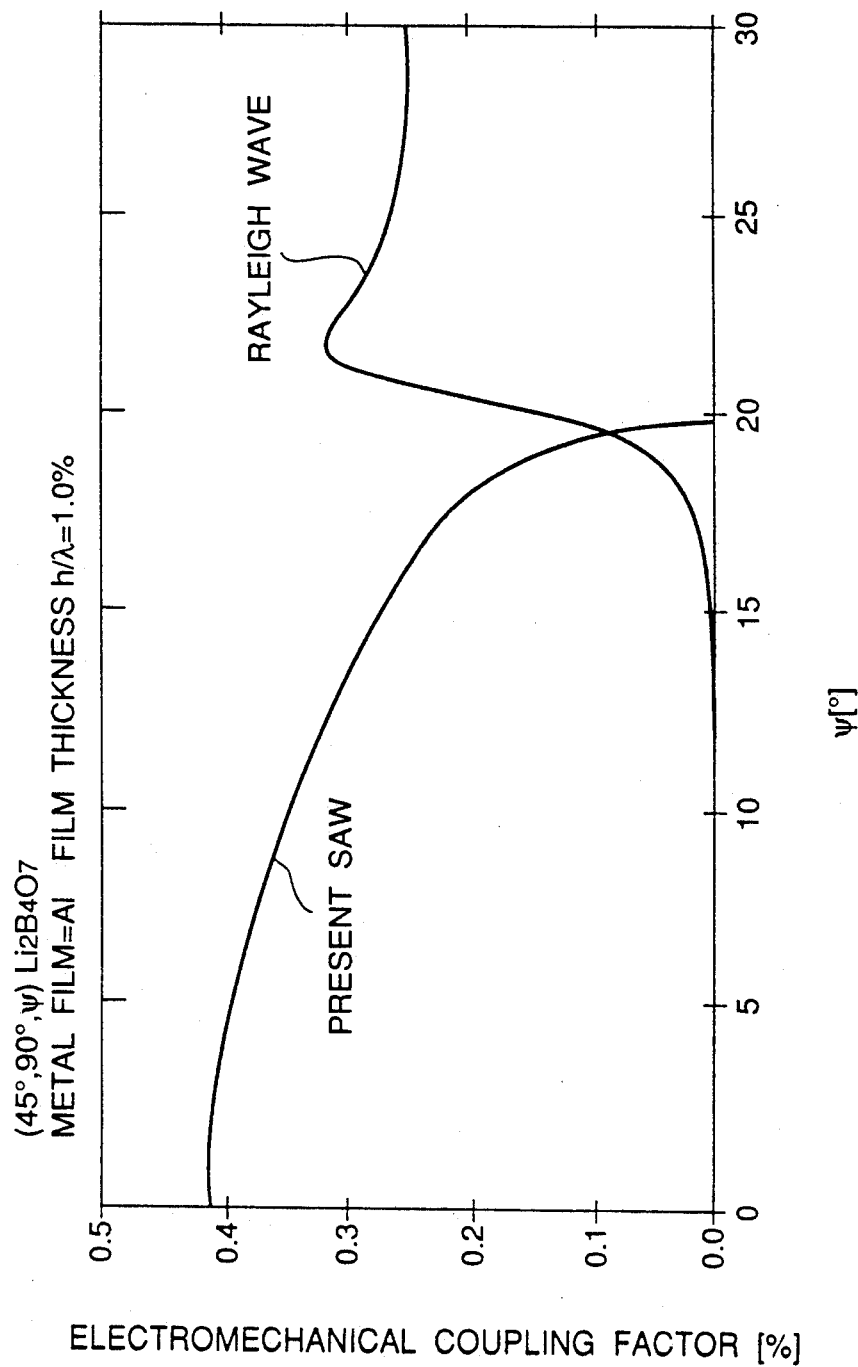
FIG. 5 is a graph of the result of the simulation on the electromechanical coupling factor in the surface acoustic wave device including on a lithium tetraborate single crystal substrate a metal film comprising aluminium as the main component, in which the angle $\psi$ of a propagation direction (45°, 90°, $\psi$) is varied.

FIGS. 4 and 5 show the results of the simulations in which when a propagation direction was in an Eulerian angle representation (45°, 90°, $\psi$), the propagation velocity [m/sec] and electromechanical coupling factor [%] of the present SAW were simulated with the angle $\psi$ changed.

It is seen from FIG. 5 that the present SAW exists in an angle $\psi$ range of 0°–20°. The angle $\psi$ range belonging to the symmetry is $-20°$–20°. In this range, as shown in FIG. 4, the present SAW has a propagation velocity of about 4400–4900 m/sec which is higher than Rayleigh waves. In the range where the present SAW exists, there is no propagation loss, and the simulation result of the propagation loss is not shown.

The same numerical simulations as in FIGS. 1 to 5, in which the angle $\phi$ was changed from 0° to 45° were conducted. In these simulations, a propagation direction of the present SAW was in an Eulerian angle representation $(\phi, 90°, \psi)$, and the angles $\phi$ and $\psi$ were changed.

Figure 6:
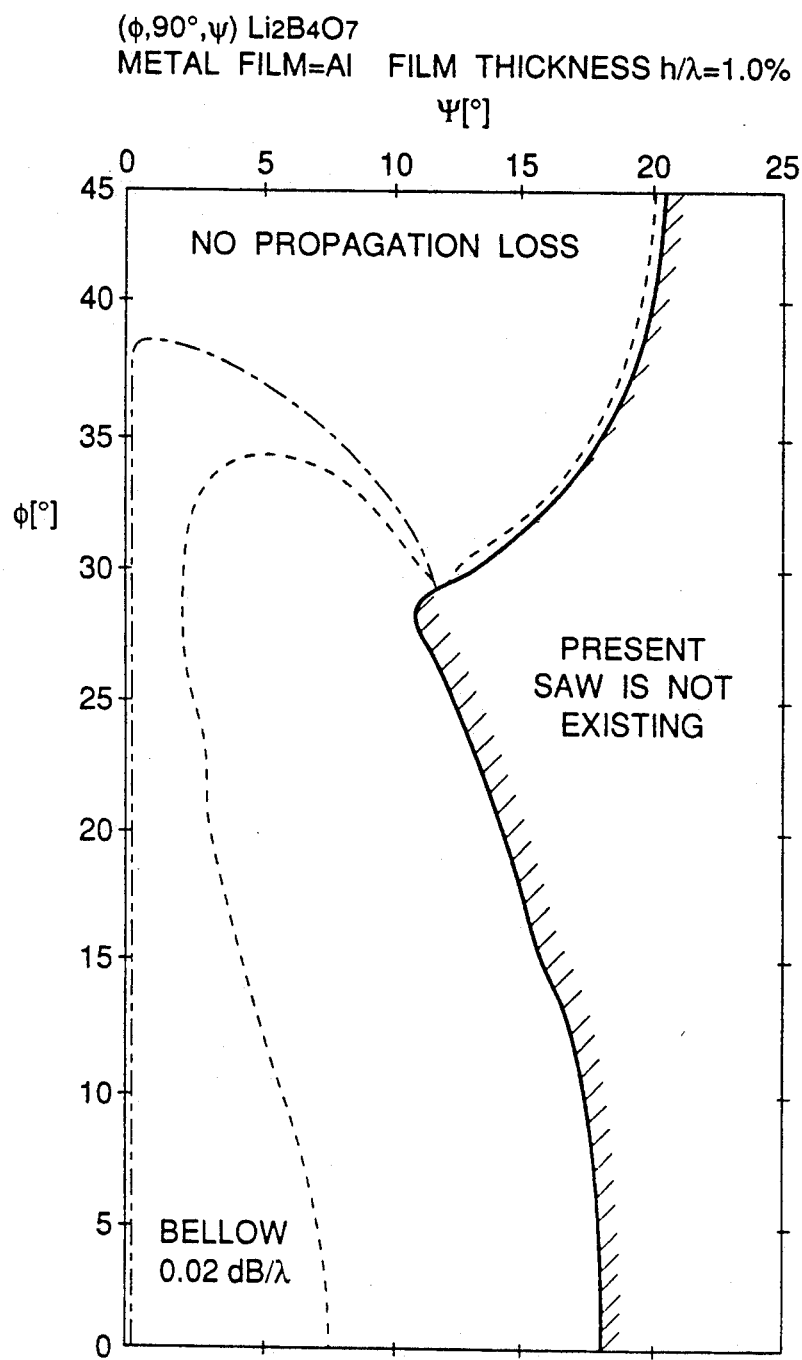
FIG. 6 is a graph of the result of the simulation in the surface acoustic wave device including on a lithium tetraborate single crystal substrate a metal film comprising aluminium as the main component, in which the angles $\phi$ and $\psi$ of a propagation direction ($\phi$, 90°, $\psi$) is varied.

The result of the simulations are shown in FIG. 6. The angle $\phi$ is taken on the vertical axis, and the angle $\psi$ is taken on the horizontal axis. Ranges in which, in the respective propagation directions, the present SAW exists, and the propagation loss of the present SAW are below a set value (0.02 dB/$\lambda$) are shown. The threshold angle $\psi$ at which the present SAW exists is indicated by the solid line, and the angle $\psi$ at which the propagation loss is the set value (0.02 dB/$\lambda$) is indicated by the one-dot-line.

In an angle $\phi$ range of 0° to 30°, as the angle $\phi$ is smaller, the range of the angle $\psi$ in which the present SAW exists, and the range of the angle $\psi$ is below 0.02 dB/$\lambda$ are relatively wider. As the angle $\phi$ comes nearer to 30°, the angle $\psi$ range in which the present SAW exists, and the angle $\phi$ range in which the propagation loss of the present SAW is below 0.02 dB/$\lambda$ becomes relatively narrower.

In the range in which the angle $\phi$ is 30° to 45°, the $\psi$ angle range in which the present SAW exists is widened from 12° to 20°. The present SAW has no propagation loss in an angle $\phi$ range of 39° to 45°.

It is seen that in the above-described range in which the present SAW exists, the electromechanical coupling factor of Rayleigh waves is so small that substantially no Rayleigh waves are generated.

1.1.2 In the Simulation in which the Angles $\phi$, $\theta$ of a Propagation Direction $(\phi, \theta, 0°)$ of the Surface Acoustic Wave are Changed The results of the simulation in which when the propagation direction of the present SAW was in an Eulerian angle representation $(\phi, \theta, 0°)$, the angles $\phi$ and $\theta$ were changed will be explained.

Figure 7:
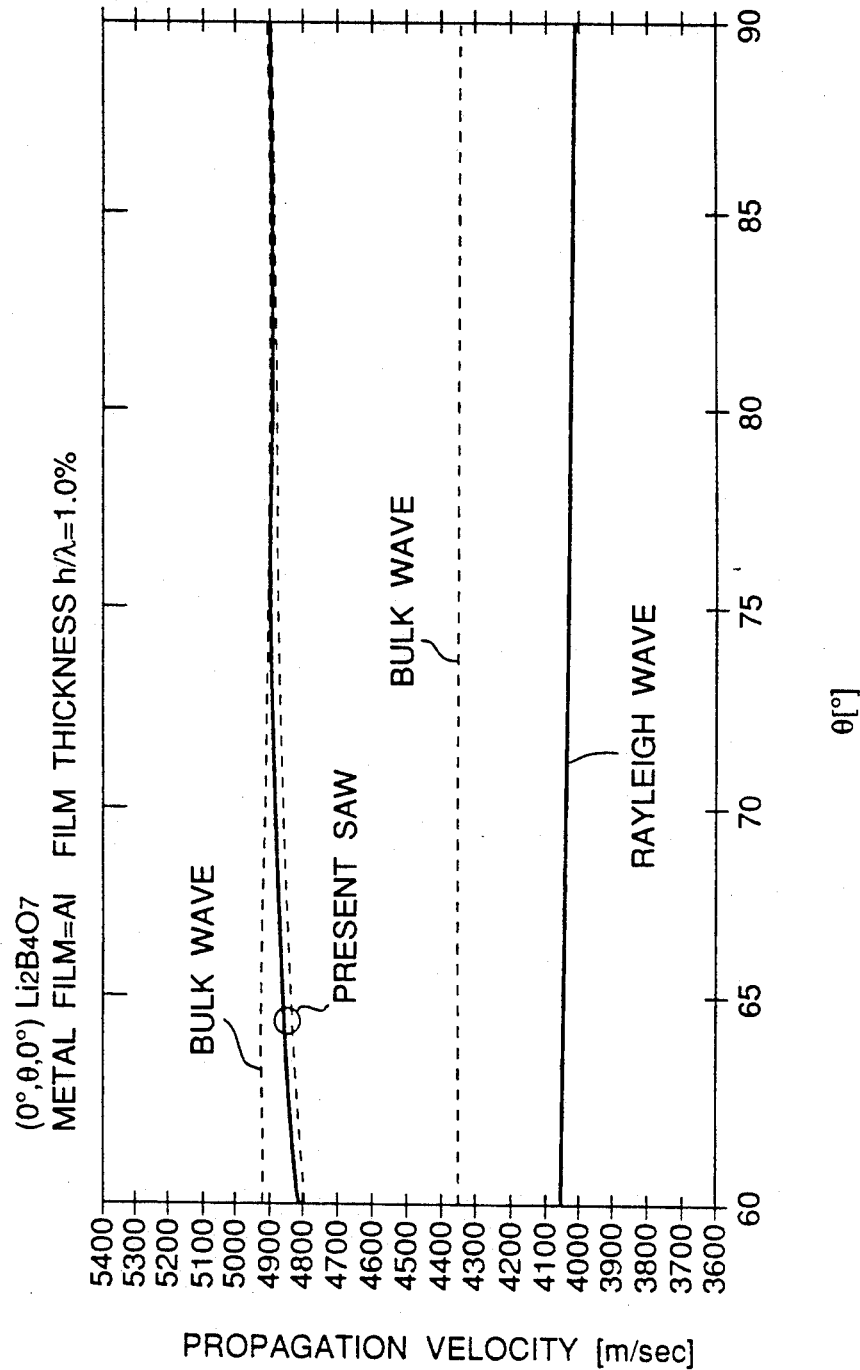
FIG. 7 is a graph of the result of the simulation on the propagation velocity in the surface acoustic wave device including on a lithium tetraborate single crystal substrate a metal film comprising aluminium as the main component, in which the angle $\theta$ of a propagation direction (0°, $\theta$, 0°) is varied.
Figure 8:
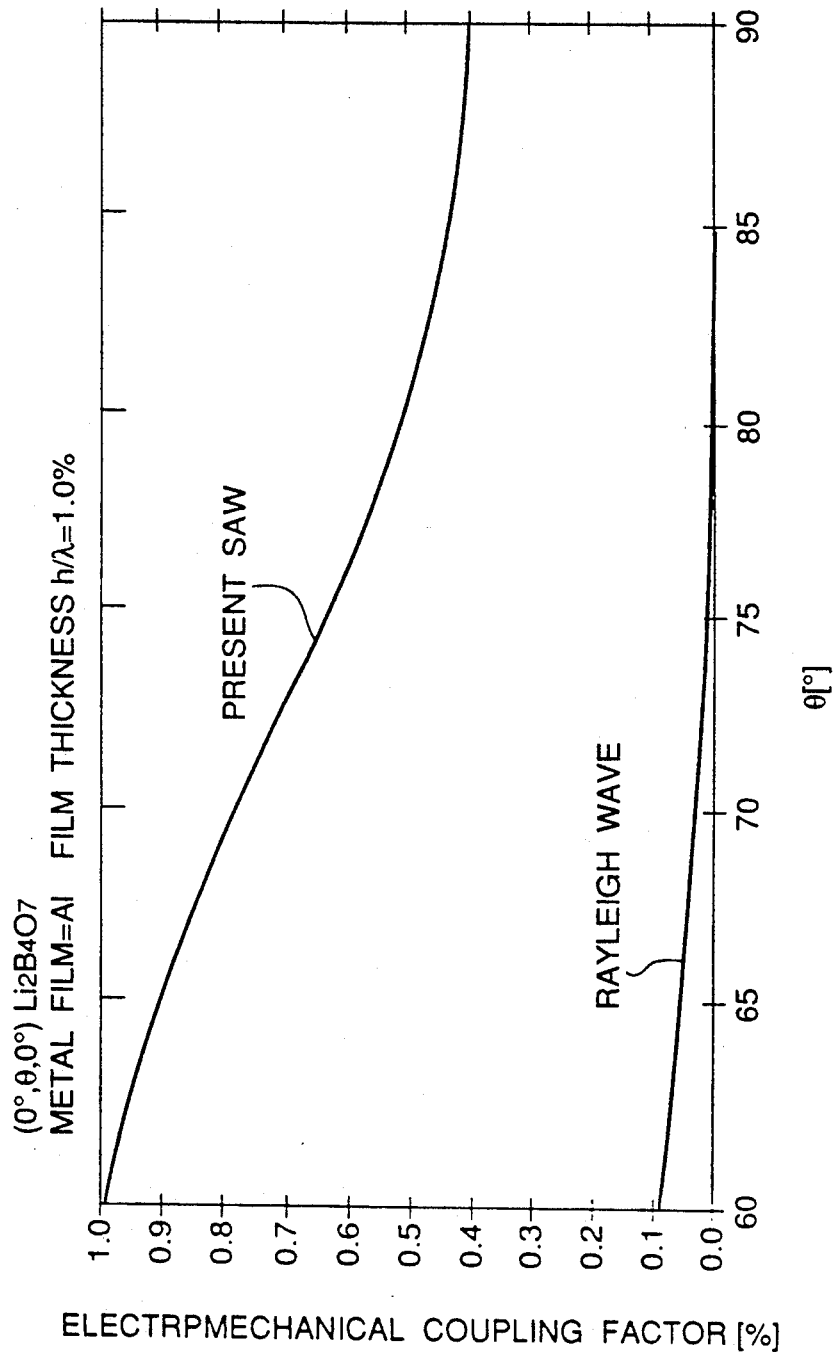
FIG. 8 is a graph of the result of the simulation on the electromechanical coupling factor in the surface acoustic wave device including on a lithium tetraborate single crystal substrate a metal film comprising aluminium as the main component, in which the angle $\theta$ of a propagation direction (0°, $\theta$, 0°) is varied.
Figure 9:
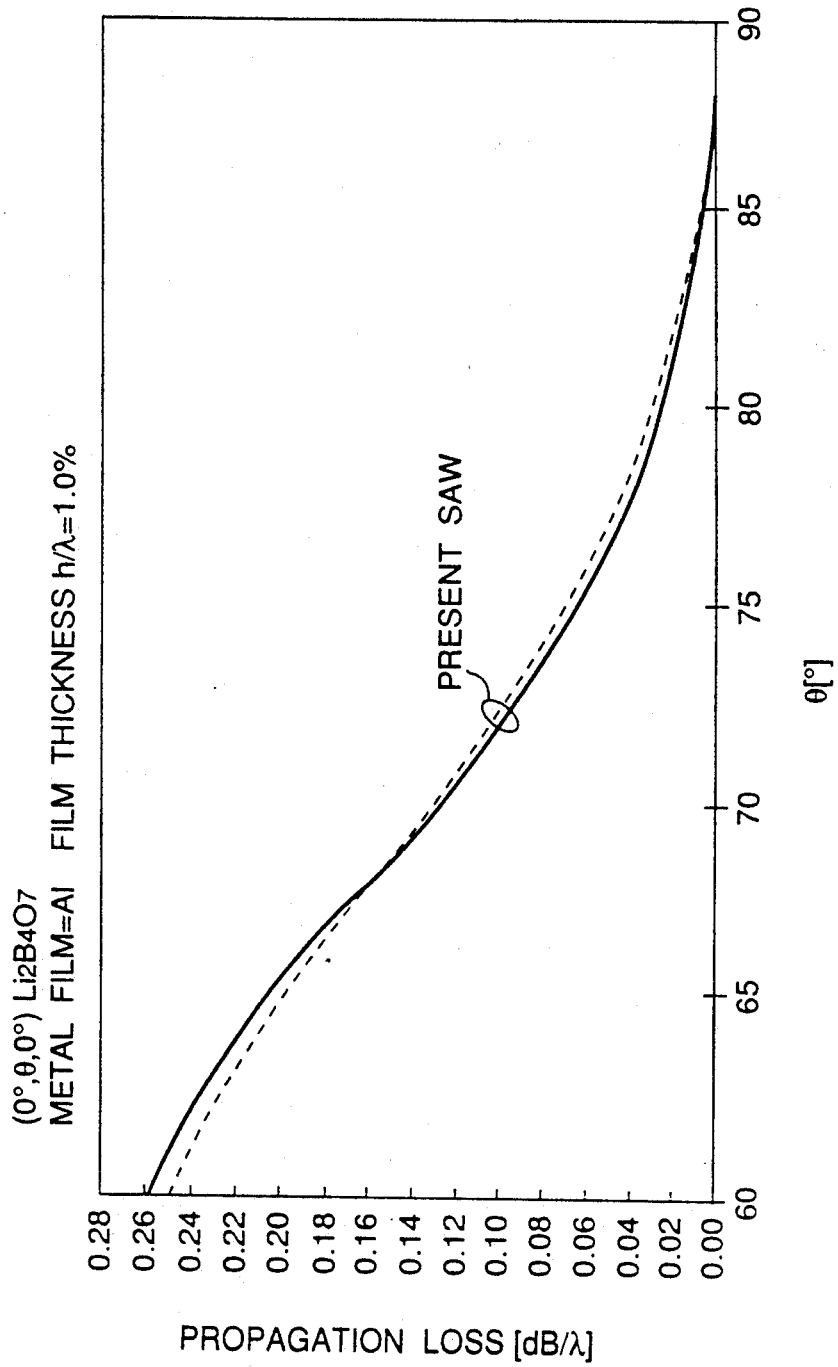
FIG. 9 is a graph of the result of the simulation on the propagation loss in the surface acoustic wave device including on a lithium tetraborate single crystal substrate a metal film comprising aluminium as the main component, in which the angle $\theta$ of a propagation direction (0°, $\theta$, 0°) is varied.

FIGS. 7 to 9 show the results of the simulation in which when a propagation direction of the surface acoustic wave was in an Eulerian angle representation $(0°, \theta, 0°)$, the propagation velocity [m/sec], the electromechanical coupling factor [%] and the propagation loss [dB/$\lambda$] were simulated with the angle $\theta$ changed.

As shown in FIG. 8, it is seen that the present SAW exists in at least an angle $\theta$ range of 60°–90°. The range of the angle $\theta$ belonging to the symmetry is 60°–120°. As shown in FIG. 7, the propagation velocity of the present SAW is about 4900 m/sec which is higher than Rayleigh waves. As shown in FIG. 9, the propagation loss of the present SAW is smaller than 0.02 dB/$\lambda$ in an angle $\theta$ range of 82°–90°.

Figure 10:
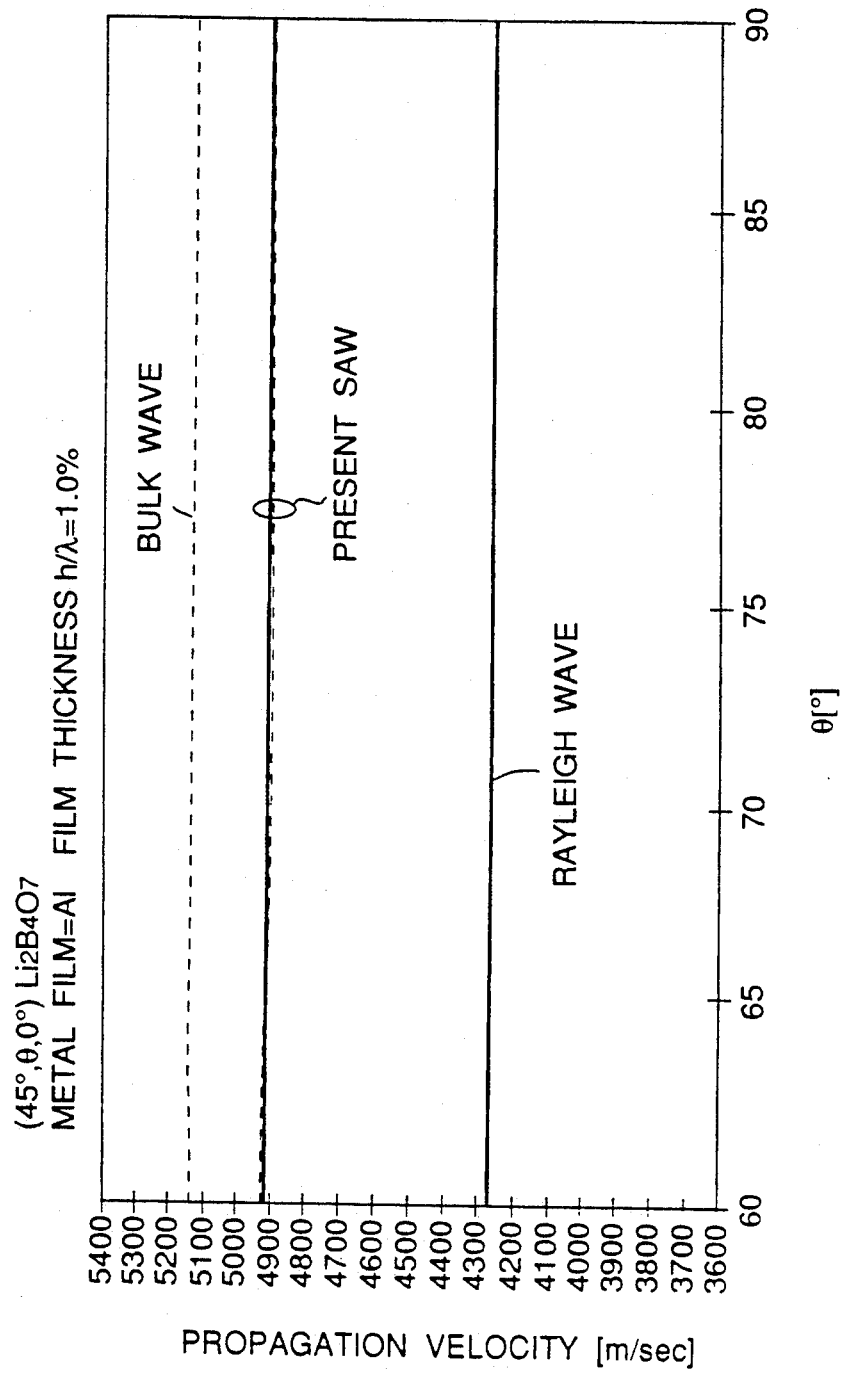
FIG. 10 is a graph of the result of the simulation on the propagation velocity in the surface acoustic wave device including on a lithium tetraborate single crystal substrate a metal film comprising aluminium as the main component, in which the angle $\theta$ of a propagation direction (45°, $\theta$, 0°) is varied.
Figure 11:
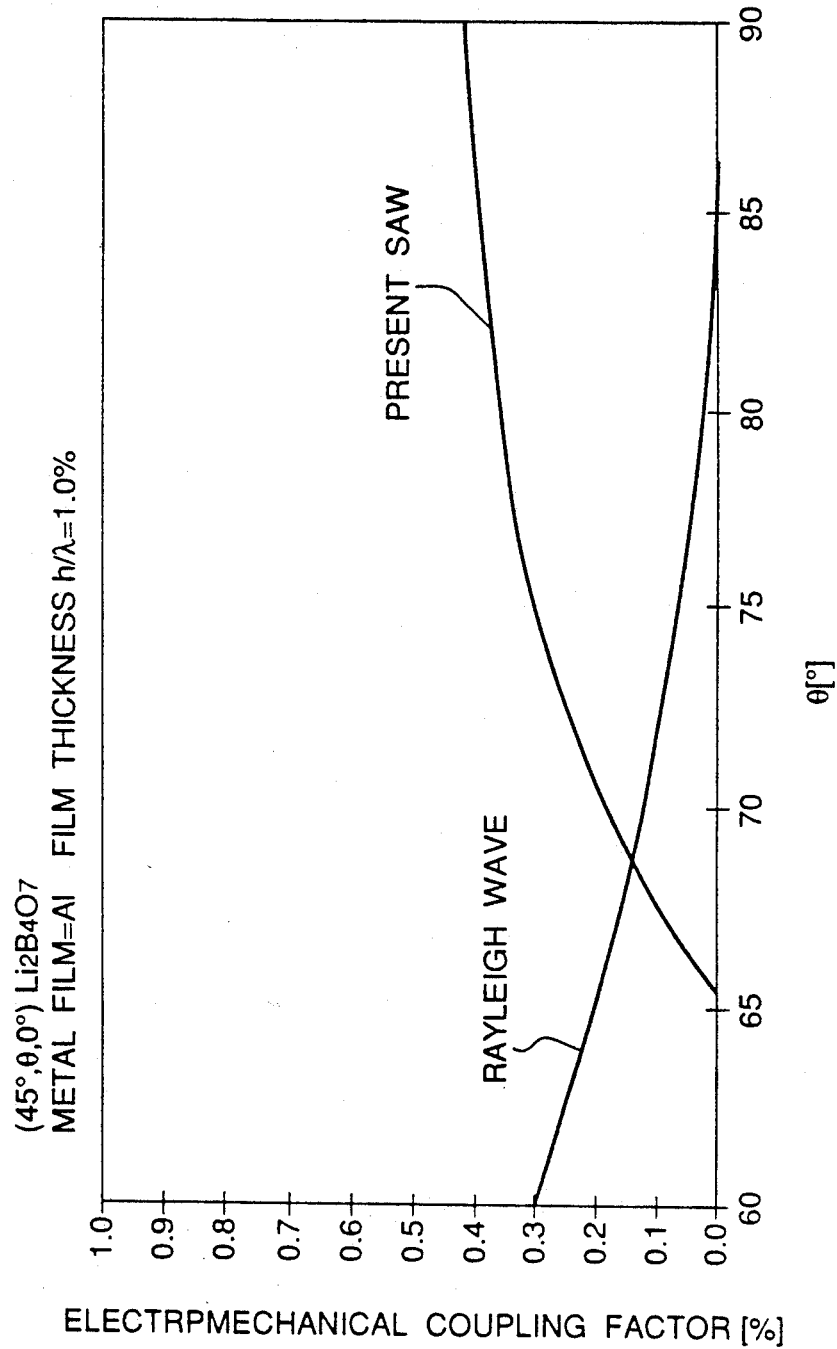
FIG. 11 is a graph of the result of the simulation on the electromechanical coupling factor in the surface acoustic wave device including on a lithium tetraborate single crystal substrate a metal film comprising aluminium as the main component, in which the angle $\theta$ of a propagation direction (45°, $\theta$, 0°) is varied.

FIGS. 10 and 11 show the results of the simulations in which a propagation direction was represented by an Eulerian angle (45°, $\theta$, 0°), the propagation velocity [m/sec] and electromechanical coupling factor [%] of the present SAW were simulated with the angle $\theta$ changed.

It is seen from FIG. 11 that the present SAW exists in an angle $\theta$ range of 66°–90°. The angle $\theta$ range belonging to the symmetry is 66°–114°. In this range, as shown in FIG. 10, the present SAW has a propagation velocity of about 4400–4900 m/sec which is higher than Rayleigh waves. In the range where the present SAW exists, there is no propagation loss. The simulation result of the propagation loss is not shown.

The same numerical simulations as in FIGS. 7 to 11 in which the angle $\theta$ was changed from 0° to 45° were conducted. In the simulations, a propagation direction of the present SAW was represented by an Eulerian angle $(\phi, \theta, 0°)$, and the angles $\phi$ and $\theta$ were changed.

Figure 12:
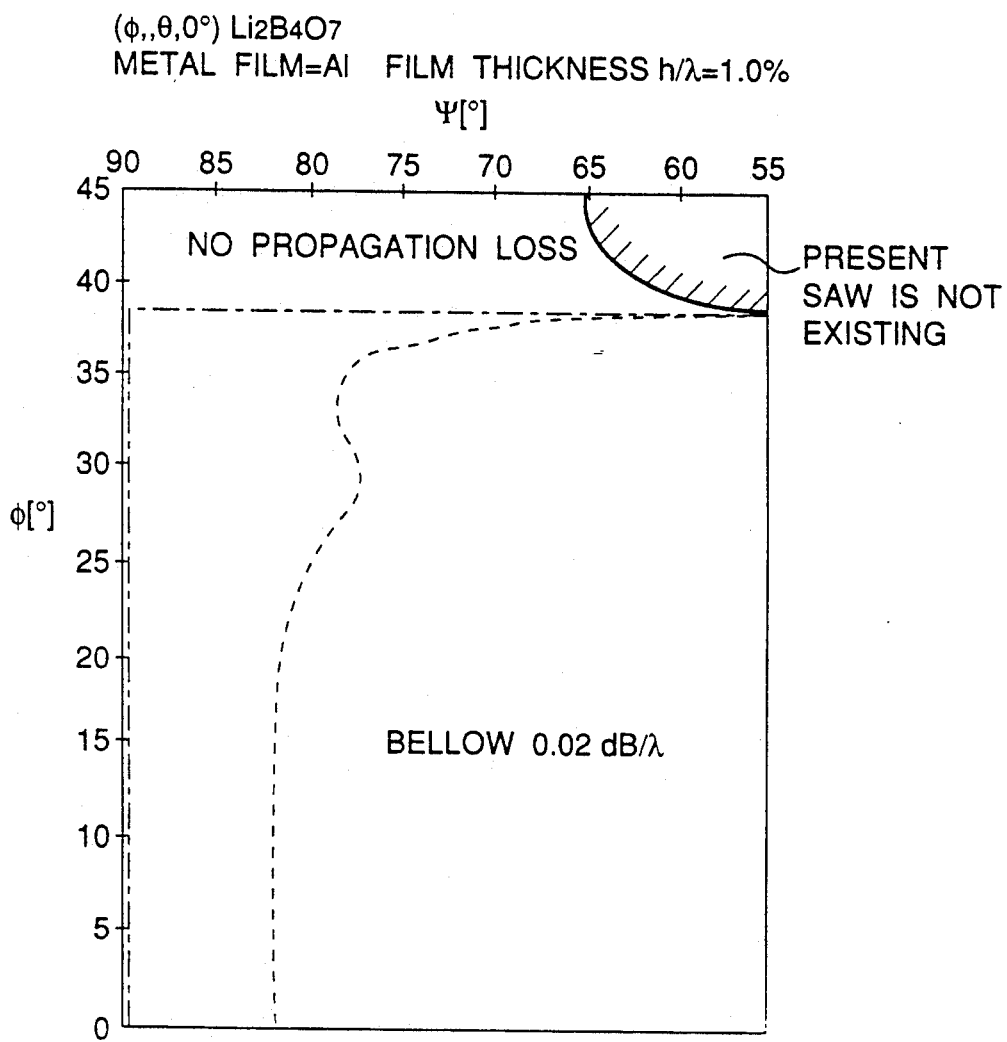
FIG. 12 is a graph of the result of the simulation, in which the angles $\phi$ and $\theta$ of a propagation direction ($\phi$, $\theta$, 0°) is varied in the surface acoustic wave device including on a lithium tetraborate single crystal substrate a metal film comprising aluminium as the main component.

The result of the simulations is shown in FIG. 12. The angle $\phi$ is taken on the vertical axis, and the angle $\theta$ is taken on the horizontal axis. Ranges in which, in the respective propagation directions, the present SAW exists, and constant propagation losses of the present SAW are below a set value (0.02 dB/λ) are shown. The threshold angle ψ at which the present SAW exists is indicated by the solid line, and the angle ψ at which the propagation loss takes place is indicated by the one-dot-line.

As shown in FIG. 12, it is seen that the characteristics of the present SAW change at an angle φ of 39°.

In an angle φ range of 0°-39°, as the angle φ is larger, the angle ψ range in which the propagation loss of the present SAW is below 0.02 dB/λ is wider. In this range there is no propagation loss of the present SAW.

It is seen that in the above-described range in which the present SAW exists, the electromechanical coupling factor of Rayleigh waves is so small that Rayleigh waves are not readily generated.

Figure 13:
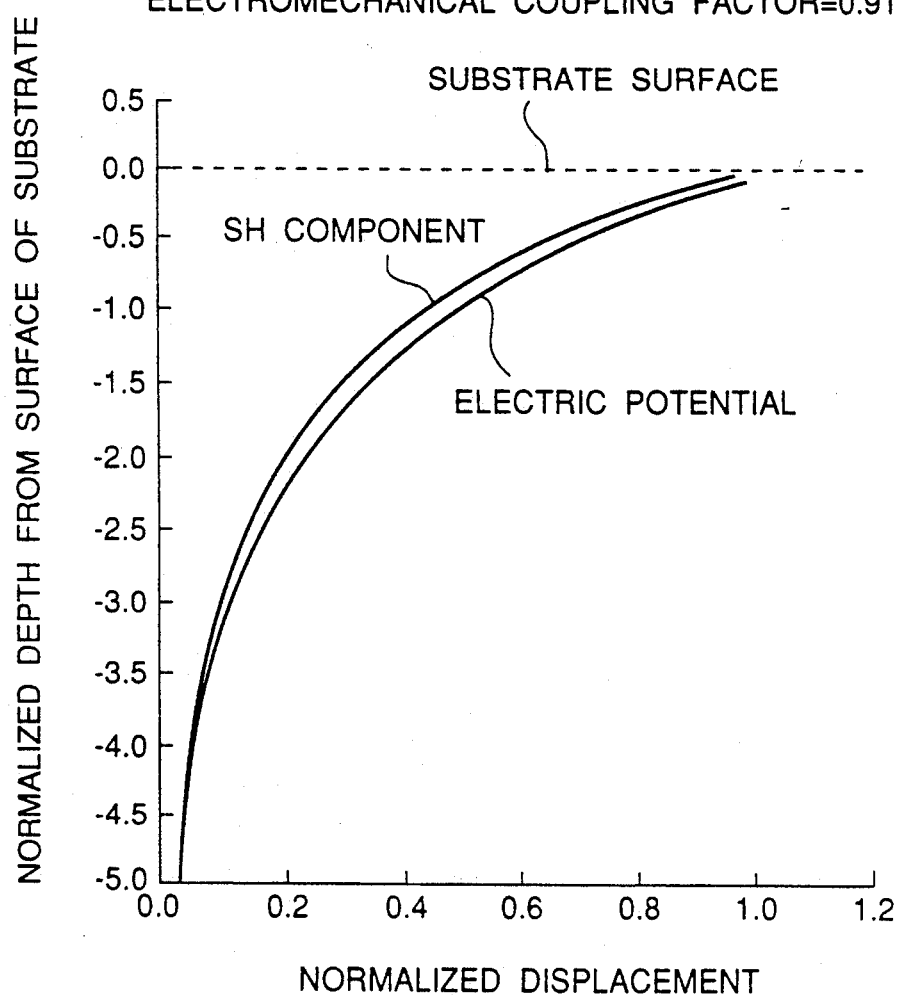
FIG. 13 is a graph of the result of the simulation, in the surface acoustic wave device including a metal film so formed on the surface of a lithium tetraborate single crystal that the propagation direction is (45°, 90°, 0°), on the displacement distribution in the direction of depth of the substrate obtained when the metal film is open.
Figure 14:
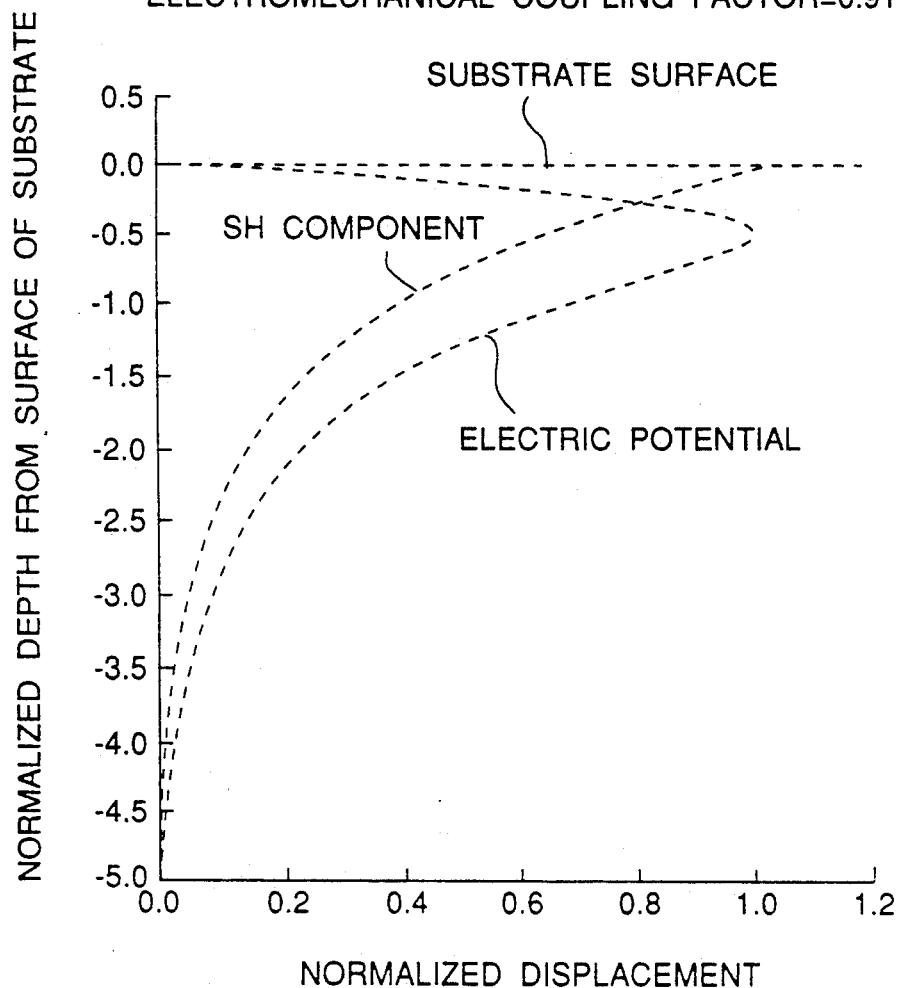
FIG. 14 is a graph of the result of the simulation, in the surface acoustic wave device including a metal film so formed on the surface of a lithium tetraborate single crystal that the propagation direction is (45°, 90°, 0°), on the displacement distribution in the direction of depth of the substrate obtained when the metal film is short.

1.2 Results of Simulations of Distributions of Displacements in the Direction of Depth of the Substrate FIG. 13 and 14 show the results of simulations of displacement distributions in the direction of depth of the substrate, which were conducted to confirm the characteristics of the present SAW. The simulations were conducted on the surface acoustic wave device including a metal film (normalized film thickness h/λ: 3%) comprising aluminium as the main component which is so formed on the surface of a lithium tetraborate single crystal substrate that a propagation direction is (45° 90°, 0°).

FIGS. 13 shows the result of the simulation in which the metal film was open. Normalized displacement amounts based on wave lengths are taken on the horizontal axis. Normalized depths from the surface of the substrate based on wave lengths are taken on the vertical axis. The propagation velocity on the surface acoustic wave was 4877 m/sec.

FIG. 14 shows the result of the simulation in which the metal film was short. The propagation velocity of the surface acoustic wave was 4855 m/sec. Under these conditions, the electromechanical coupling factor was 0.91%, and the propagation loss per one wave length was 0 dB.

As shown in FIGS. 13 and 14, it is seen that the present SAW has larger displacements toward the substrate surface and is SH (horizontal shear) wave-type surface acoustic waves mostly having SH component.

1.3 The Result of Simulations of Characteristics of the Surface Acoustic Wave which Propagates over Plane (110) of Lithium Tetraborate Single Crystal in the Direction <1$\bar{1}$0> (Eulerian Angle Representation (45°, 90°, 0°))

The metal film was formed on plane (110) of lithium tetraborate single crystal, and simulations were made on characteristics of surface acoustic waves which propagate in the direction <1$\bar{1}$0> (Eulerian angle representation (45°, 90°, 0°)). FIGS. 15 to 20 show the results of the simulations on the propagation velocity and the electromechanical coupling factor for normalized film thicknesses h/λ which are set by standardizing metal film thicknesses h by wave lengths λ of surface acoustic waves.

Figure 15:
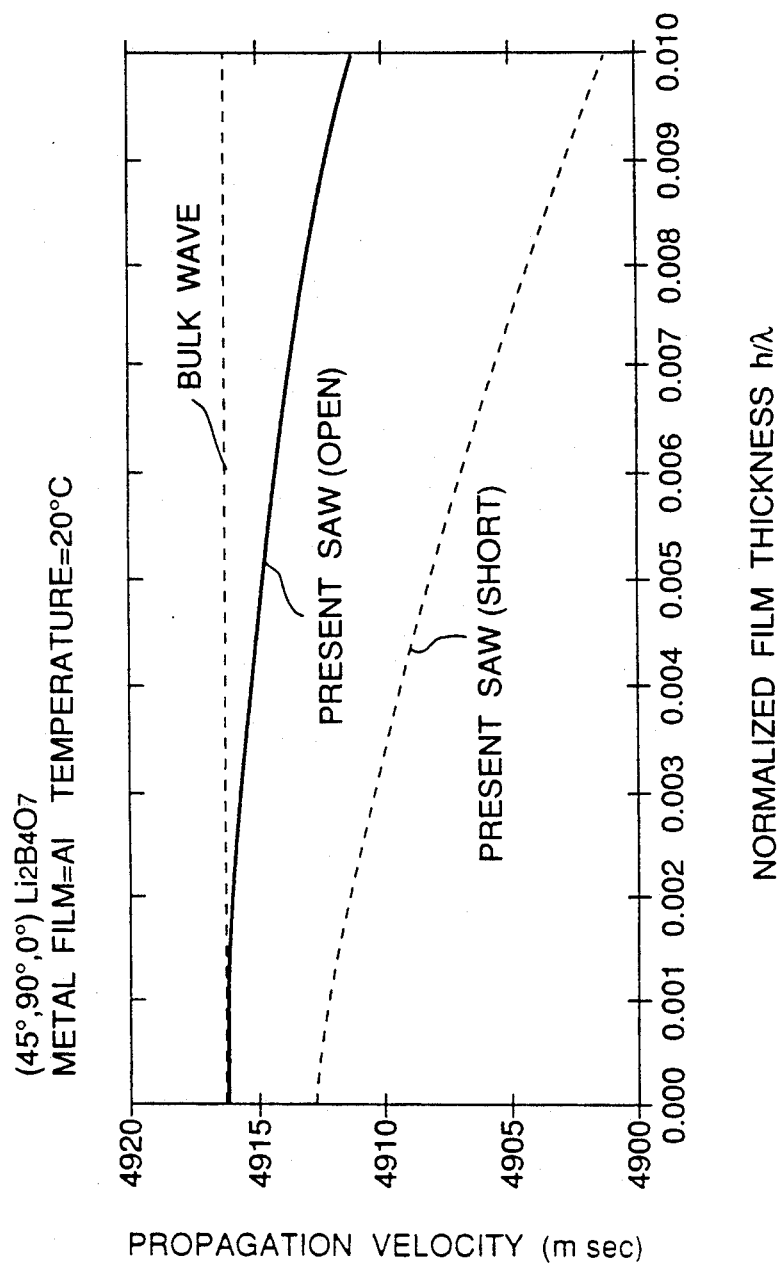
FIG. 15 is a graph of the result of the simulation on the propagation velocity in the surface acoustic wave device including on a lithium tetraborate single crystal substrate a metal film comprising aluminium as the main component, in which the normalized film thickness $h/\lambda$ of the metal film is varied from 0 to 1%.
Figure 16:
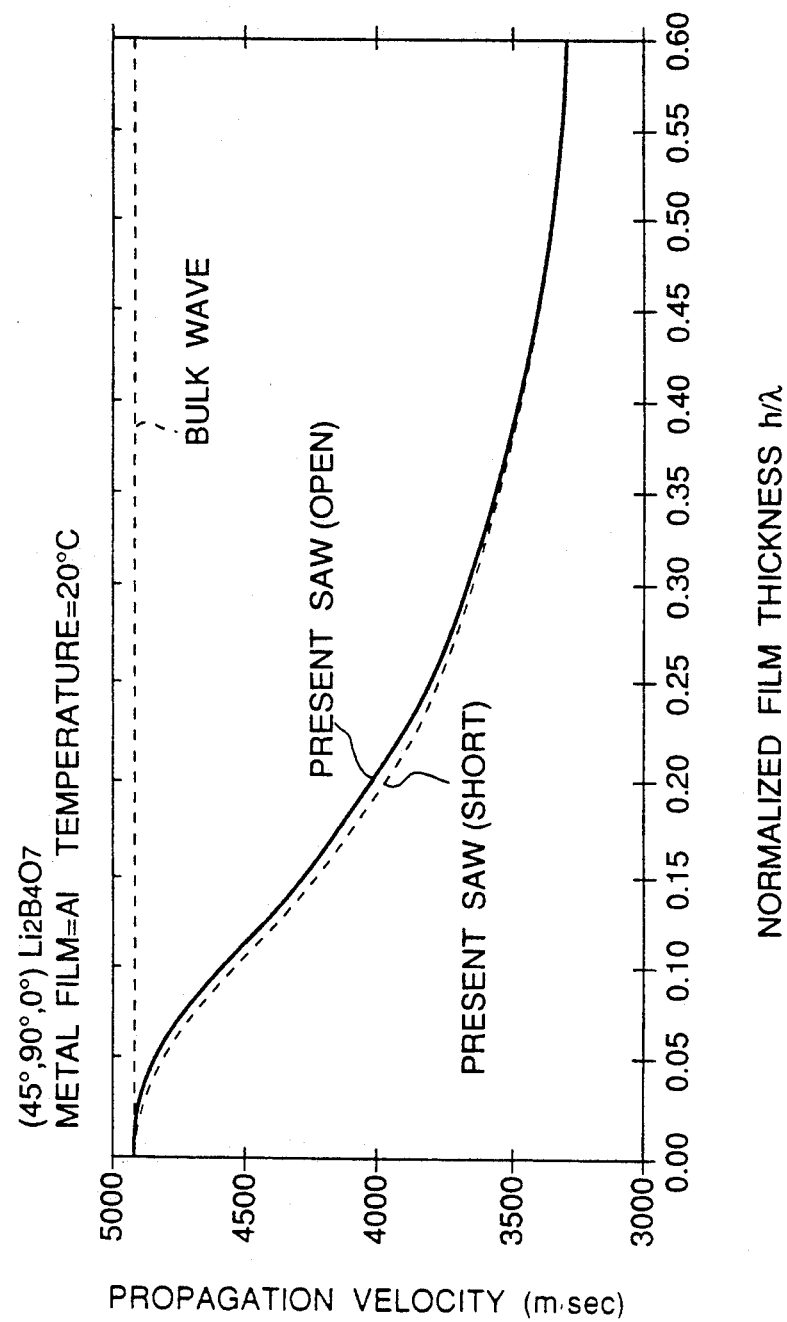
FIG. 16 is a graph of the result of the simulation on the propagation velocity in the surface acoustic wave device including on a lithium tetraborate single crystal substrate a metal film comprising aluminium as the main component, in which the normalized film thickness $h/\lambda$ of the metal film is varied from 0 to 60%
Figure 17:
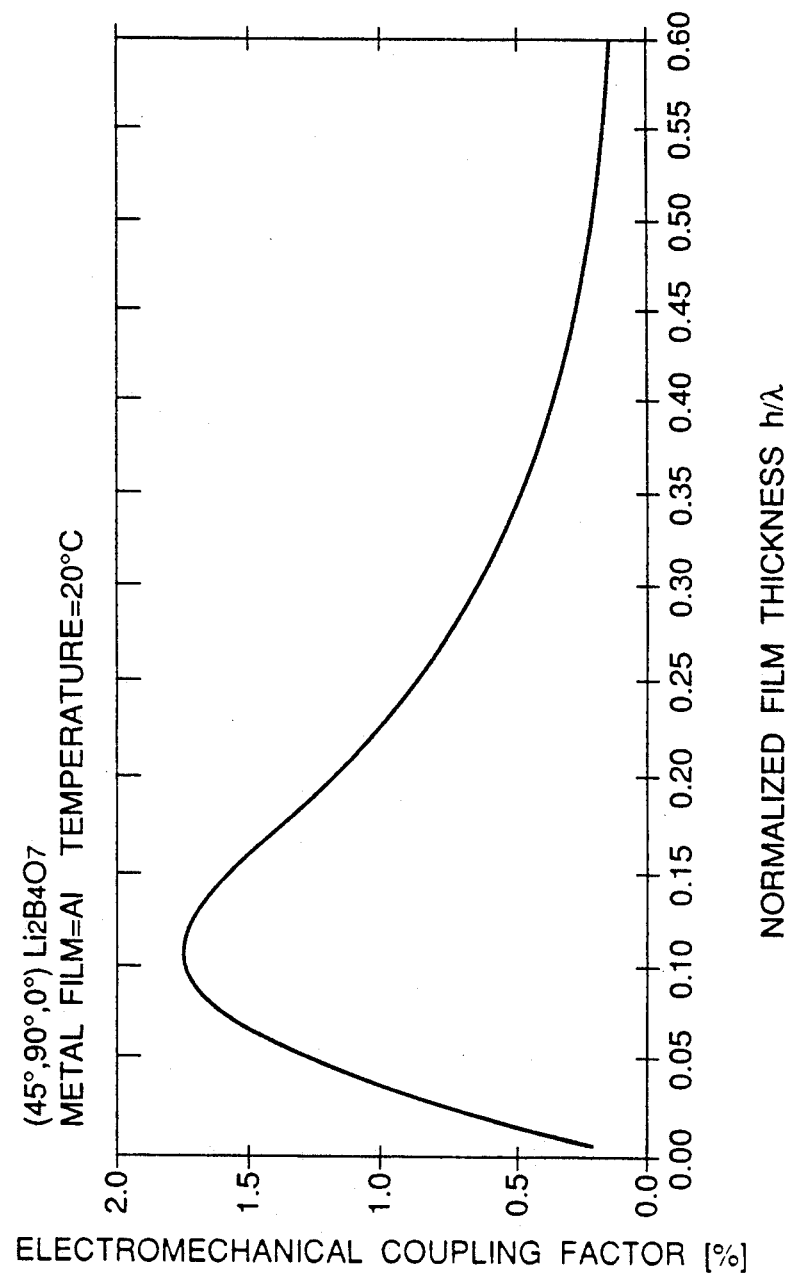
FIG. 17 is a graph of the result of the simulation on the electromechanical coupling factor in the surface acoustic wave device including on a lithium tetraborate single crystal substrate a metal film comprising aluminium as the main component, in which the normalized film thickness $h/\lambda$ of the metal film is varied from 0 to 60%.

1.3.1 The Case that the Metal Film is Formed of a Metal Comprising Aluminium as the Main Component FIGS. 15 to 17 show the results of the simulations in which the metal film is formed of a metal comprising aluminium as the main component. FIGS. 15 and 16 show the propagation velocity. The solid lines indicate the simulation results of the propagation velocity when the metal film is open (the metal film is non-conductive), and the broken lines indicate the simulated propagation velocity when the metal film is short (the metal film is conductive). FIG. 17 shows the simulation result of the electromechanical coupling factor.

As shown in FIGS. 15 and 16, the normalized film thickness h/λ of the metal film is changed from 0.0 to 60%, the propagation velocity gradually decreases. As shown in FIGS. 15 and 16, the present SAW has a high propagation velocity as high as 4300 m/sec in a normalized film thickness h/λ range of 0 to 15%.

As shown n FIG. 17, even though the normalized film thickness h/λ of the metal film is changed from 0.0 to 60%, the present SAW is present, and an electromechanical coupling factor above 0.5% can be obtained in a normalized film thickness h/λ range of 2 to 35%.

Thus it was found that the present SAW is present in the range where the metal film of aluminium has a normalized film thickness h/λ of 0 to 60%. Preferably the metal film has a normalized film thickness h/λ of 2 to 15%, because the present SAW has a propagation velocity as high as above 4300 m/sec and an electromechanical coupling factor of above 0.5%, and can be effectively used.

1.3.2 The Case that the Metal Film Comprises Gold as the Main Component

Figure 18:
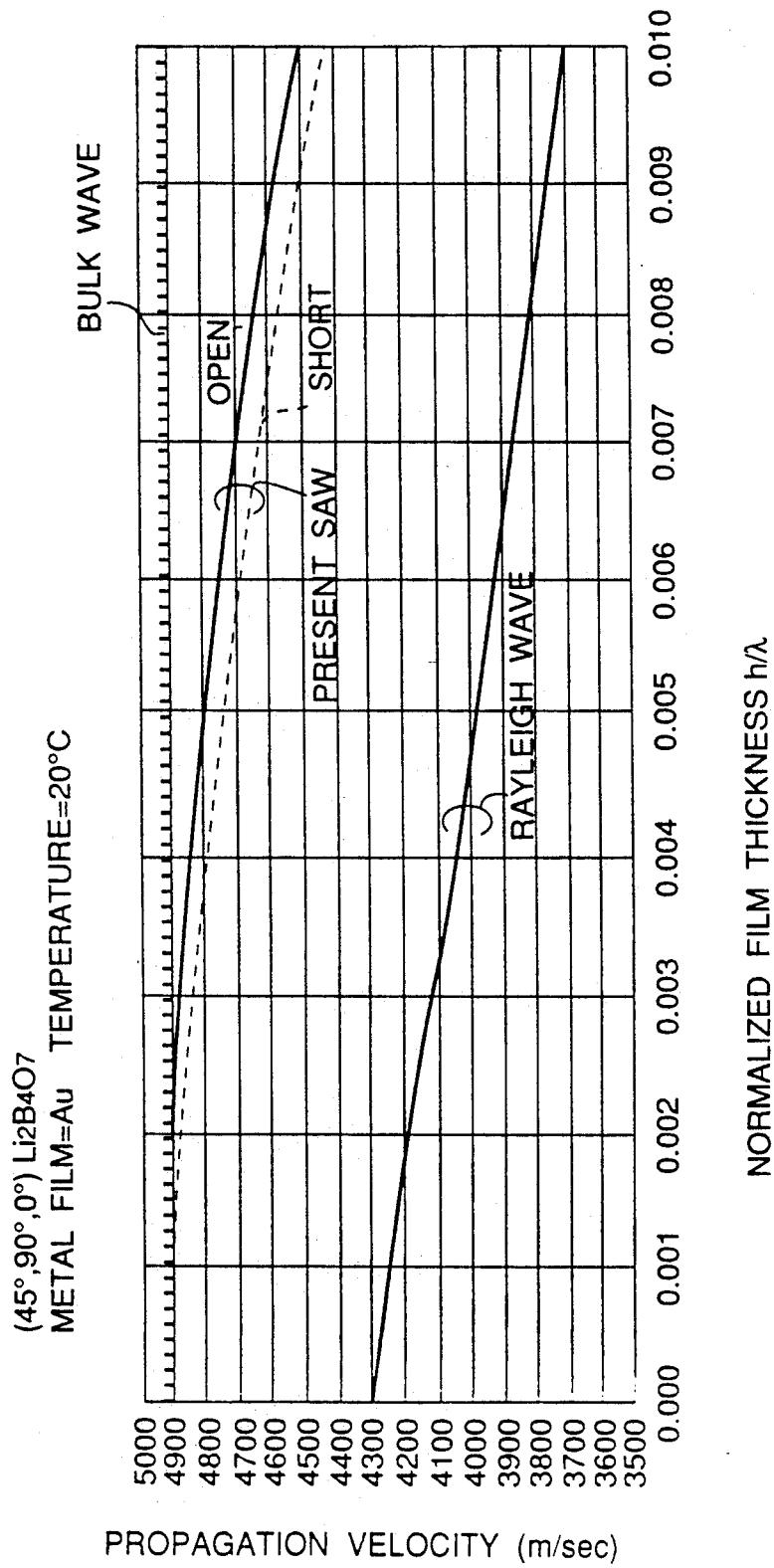
FIG. 18 is a graph of the result of the simulation on the propagation velocity in the surface acoustic wave device including on a lithium tetraborate single crystal substrate a metal film comprising gold as the main component, in which the normalized film thickness $h/\lambda$ of the metal film is varied from 0 to 1%.
Figure 19:
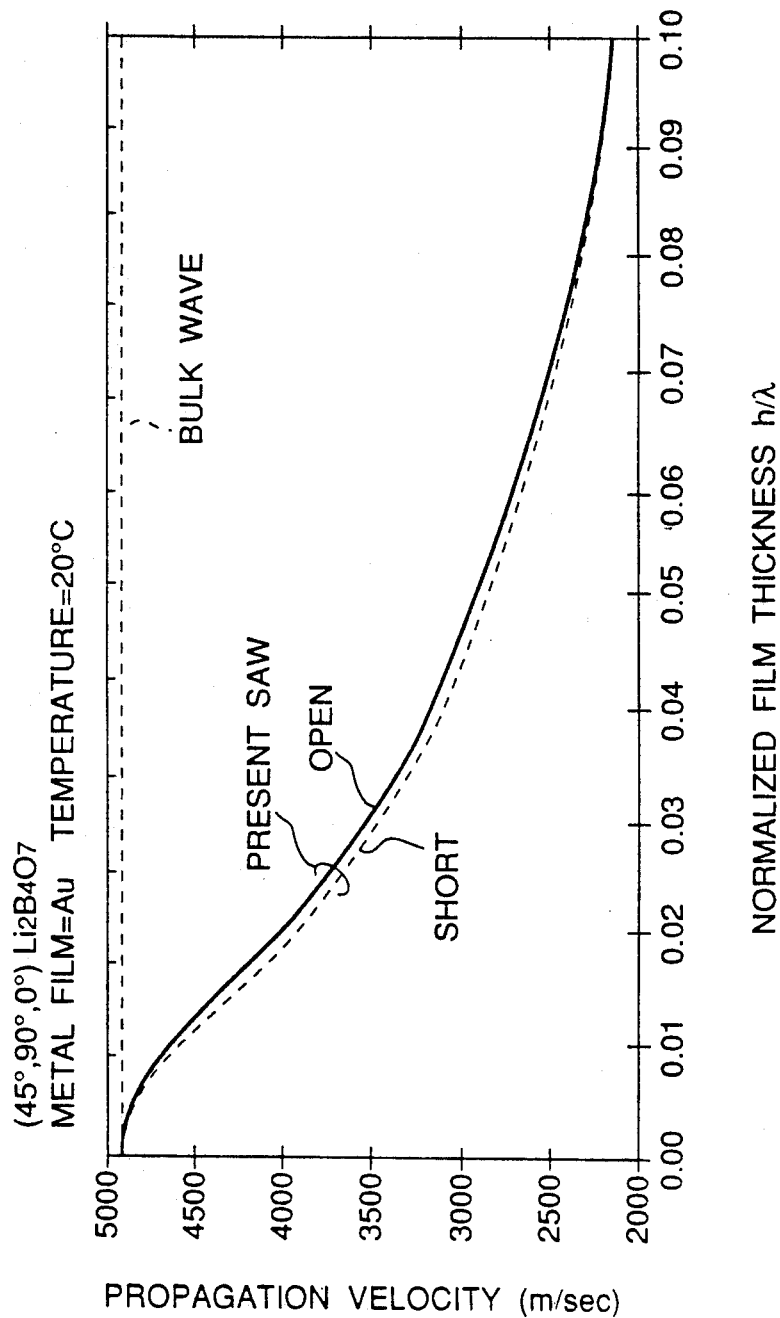
FIG. 19 is a graph of the result of the simulation on the propagation velocity in the surface acoustic wave device including on a lithium tetraborate single crystal substrate a metal film comprising gold as the main component, in which the normalized film thickness $h/\lambda$ of the metal film is varied from 0 to 10%.
Figure 20:
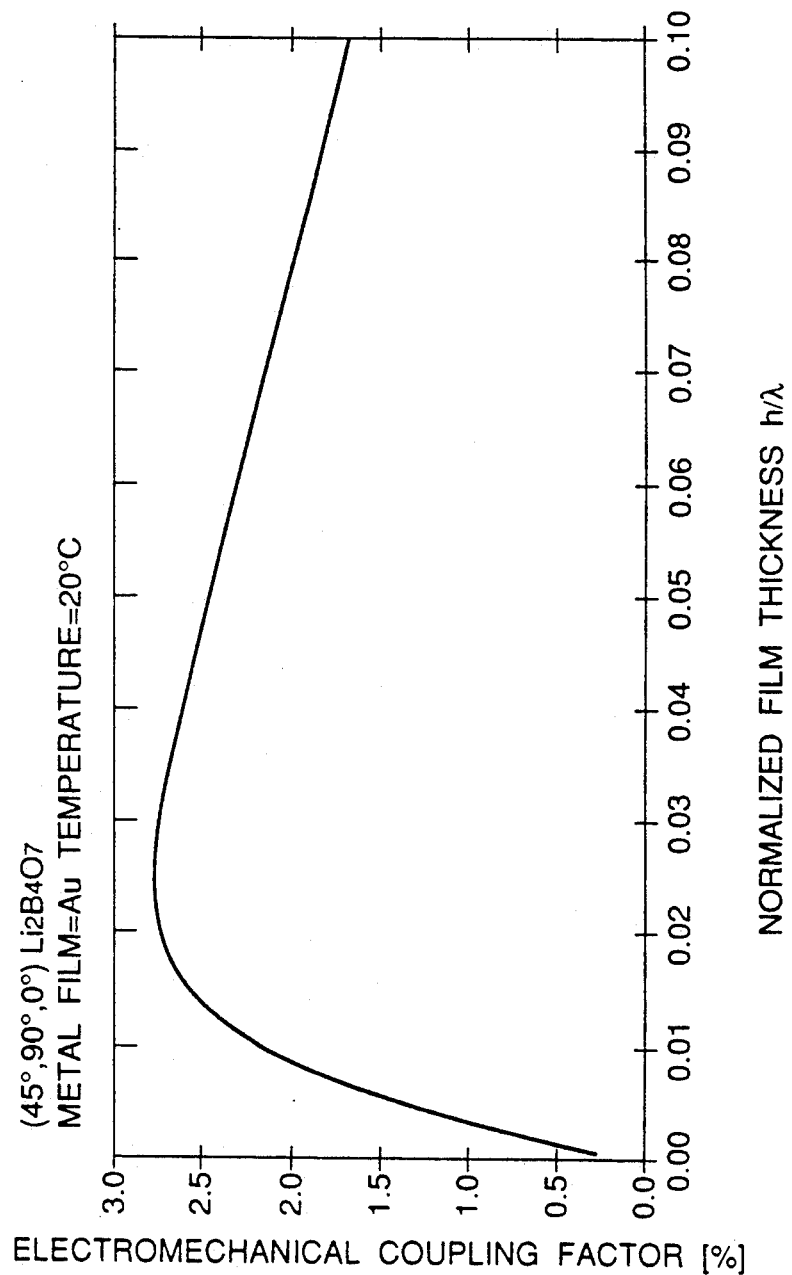
FIG. 20 is a graph of the result of the simulation on the electromechanical coupling factor in the surface acoustic wave device including on a lithium tetraborate single crystal substrate a metal film comprising gold as the main component, in which the normalized film thickness $h/\lambda$ of the metal film is varied from 0 to 10%.

FIGS. 18 to 20 shows the results of the simulations in which the metal film was formed of a metal comprising gold as the main component. FIG. 18 and 19 show the propagation velocity. The solid lines indicate the simulation results of the propagation velocity of the present SAW when the metal is open. The broken lines indicate the simulation results of the propagation velocity of the present SAW when the metal film is short. FIG. 20 shows the simulation result of the electromechanical coupling factor.

As shown in FIGS. 18 and 19, the normalized film thickness h/λ of the metal film is changed from 0.0 to 10%, the propagation velocity gradually decreases. As shown in FIGS. 18 and 19, the present SAW has a high propagation velocity as high as 4900-4300 m/sec in a normalized film thickness h/λ range of 0 to 1.5%. In contrast to this, Rayleigh waves can only have a propagation velocity as low as below 4300 m/sec.

As shown in FIG. 20, it is found that when the normalized film thickness h/λ of the metal film is changed from 0.0 to 10%, the electromechanical coupling factor is above 0.5% when the normalized film thickness h/λ is above 0.2%. The electromechanical coupling factor can be above 2.5% in the normalized film thickness h/λ of 1.5 to 4.5%.

Thus, the present SAW is present in a range of the normalized film thickness h/λ of 0 to 10%. Preferably the metal film has a normalized film thickness h/λ of 0.2 to 1.5%, because the present SAW has a propagation velocity as high as above 4300 m/sec and an electromechanical coupling factor of above 0.5%, and can be effectively used.

1.4 Electrode Model Used in the Simulations

Figure 21A:
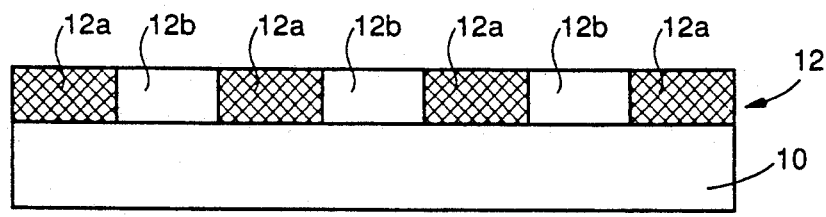
FIGS. 21A to 21D are views of a model electrode structure used in the simulations of the present invention.

The simulations of the present invention were conducted based on the model electrode structure as shown in FIG. 21A that a layer 12 of a sufficient mass is formed on the entire surface of a piezoelectric substrate 10 of lithium tetraborate single crystal, and the layer 12 is divided in stripes of conducting parts 12a and stripes of non-conducting parts 12b. These conducting parts 12a function as the electrode for exciting, receiving, reflecting and/or propagating the surface acoustic waves.

Figure 21B:
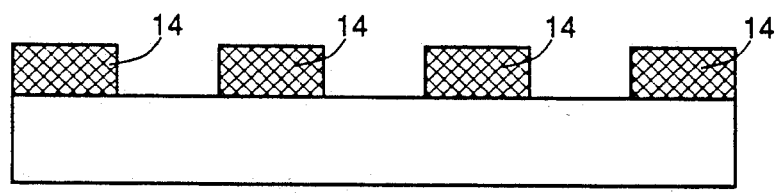
Figure 21C:
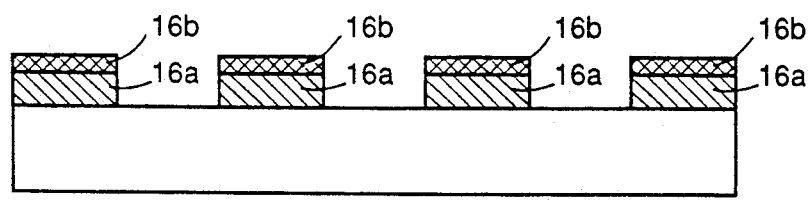
Figure 21D:
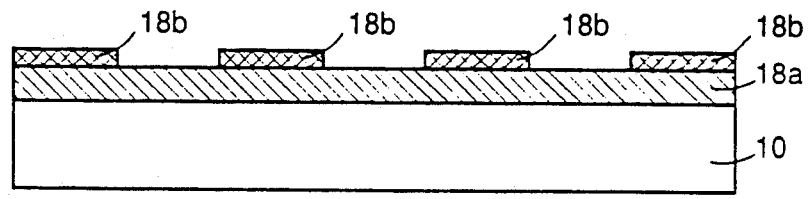

The results of the simulations using the electrode structure of FIG. 21A are applicable to the electrode structures of FIGS. 21B to 21D as well as the electrode structure of FIG. 21A.

That is, the electrode structure model of FIG. 21A is applicable to the electrode structure (1) of FIG. 21B comprising stripes of electrode 14 formed on a piezoelectric substrate 10 of lithium tetraborate single crystal, the electrode structure (2) of FIG. 21C comprising stripes of insulating layer 16a formed on a piezoelectric substrate 10 of lithium tetraborate single crystal, and thin metal layers 16b formed on the insulating layers 16a, the electrode structure (3) of FIG. 21D comprising an insulating layer 18a formed on the entire surface of a piezoelectric substrate 10 of lithium tetraborate single crystal, and stripes of thin metal film 18b formed on the insulating layers 18a.

1.5 Results of Simulations in which a Silicon Dioxide Film was Formed as an Insulating Film on a Substrate of Lithium Tetraborate Single Crystal and a Metal Film In a simulation in which a metal film (normalized film thickness $h/\lambda=1.0\%$) of a metal comprising aluminium as the main component was formed on a lithium tetraborate single crystal substrate so that a propagation direction of the surface acoustic wave was in an Eulerian angle representation (45°, 90°, 0°), and a silicon dioxide film as an insulating film was formed on the lithium tetraborate single crystal substrate and the metal film, the characteristics of the surface acoustic wave with the film thickness of the silicon dioxide changed were simulated. The simulation results will be explained with reference to FIGS. 22 and 23.

Figure 22A:
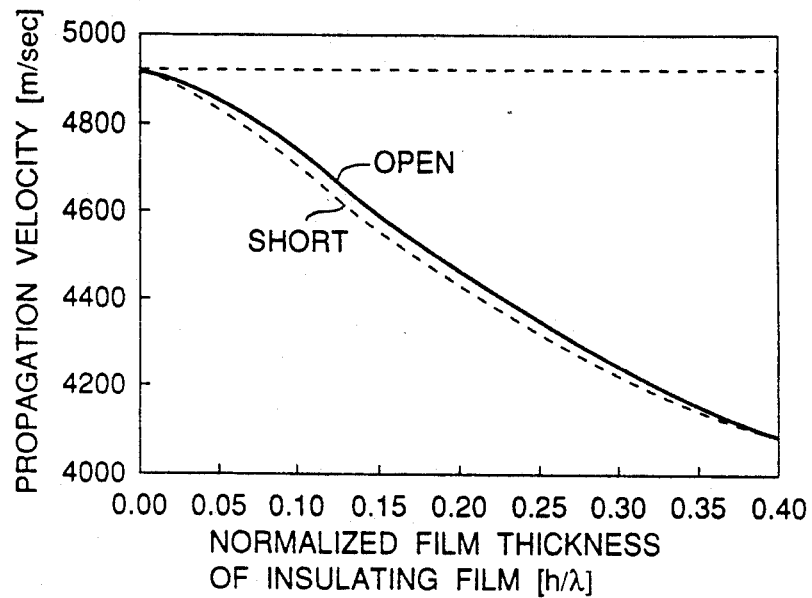
FIGS. 22A and 22B are graphs of the result of the simulation on the propagation velocity and the electromechanical coupling factor in the surface acoustic wave device including on a lithium tetraborate single crystal substrate a metal film comprising gold as the main component, and a silicon dioxide film on the substrate and the metal film, in which the normalized film thickness $h/\lambda$ of the silicon dioxide film is varied from 0 to 40%.
Figure 22B:
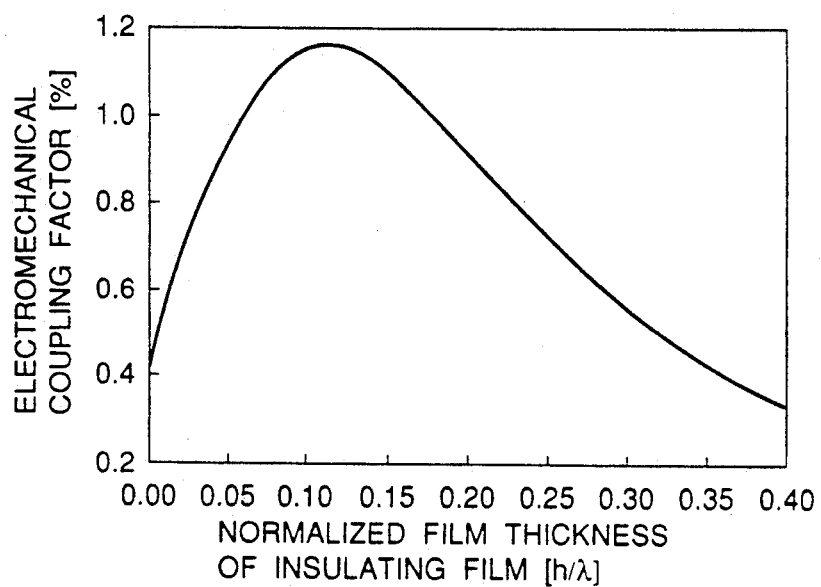
Figure 23:
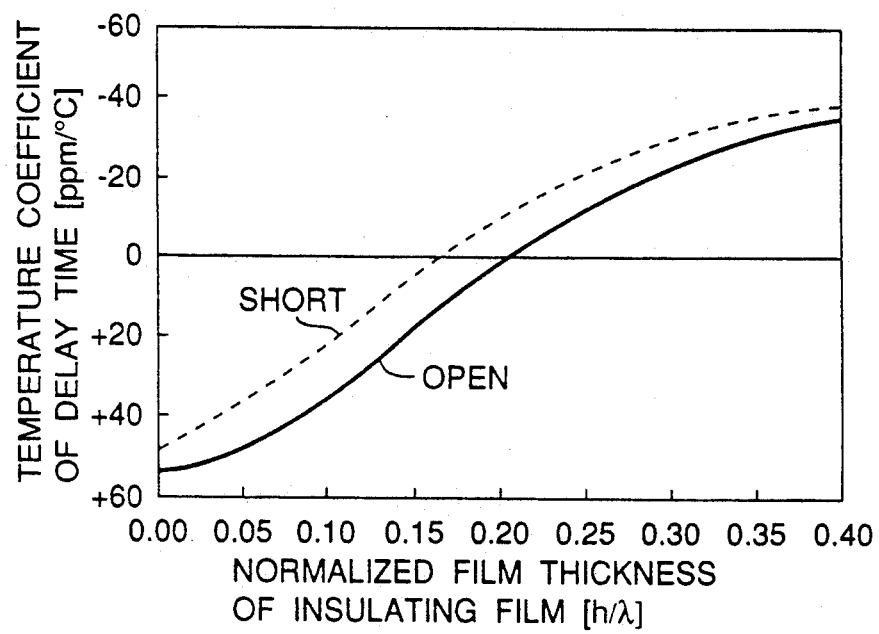
FIG. 23 is a graph of the result of the simulation on the temperature coefficient of the delay time in the surface acoustic wave device including on a lithium tetraborate single crystal substrate a metal film comprising gold as the main component, and a silicon dioxide film on the substrate and the metal film in which the normalized film thickness $h/\lambda$ of the silicon dioxide film is varied from 0 to 40%.

FIGS. 22A and 22B show the result of the simulations on the propagation velocity [m/sec] and the electromechanical coupling factor [%] of the present SAW with respect to the normalized film thickness $h/\lambda$ of the silicon dioxide. FIG. 23 shows the result of the simulation on the temperature coefficient [ppm/°C] of the delay time.

As shown in FIG. 22A, as the thickness of the silicon dioxide film increases, the propagation velocity of the present SAW gradually decreases, but, as shown in FIG. 22B, the electromechanical coupling factor of the present SAW is better in the range where the normalized film thickness of the silicon dioxide film is 1–35%. The present SAW has no propagation loss. In addition, as shown in FIG. 23, the absolute value of the temperature coefficient of the present SAW is as small as below 20 ppm/°C. in the range in which the normalized film thickness of the silicon dioxide film is 10–25%.

Based on the showings of FIGS. 22 and 23, simply the metal film is so formed that the cut angle and the propagation direction of the lithium tetraborate single crystal substrate are in a required range, and the insulating film is formed thereon, whereby a surface acoustic wave device having high propagation velocity and small propagation loss can be realized. In the range in which the normalized film thickness of the silicon dioxide film is 1–35%, high electromechanical coupling factors can be obtained. Filters can have wide band width. In the range in which the normalized film thickness of the silicon dioxide film is 10–25%, not only high electromechanical coupling factors but also very small temperature coefficients of the propagation velocity of the surface acoustic wave can be obtained.

In the above-described simulation, the insulating film was provided by silicon dioxide, but in place of silicon dioxide, $SiO_x$, PGS (phosphorus silicate glass), $Al_2O_3$ (alumina), or others may be used.

2. Examples

2.1 A First Example

The surface acoustic wave device according to a first example of the present invention will be explained with reference to FIGS. 24 to 26.

Figure 24:
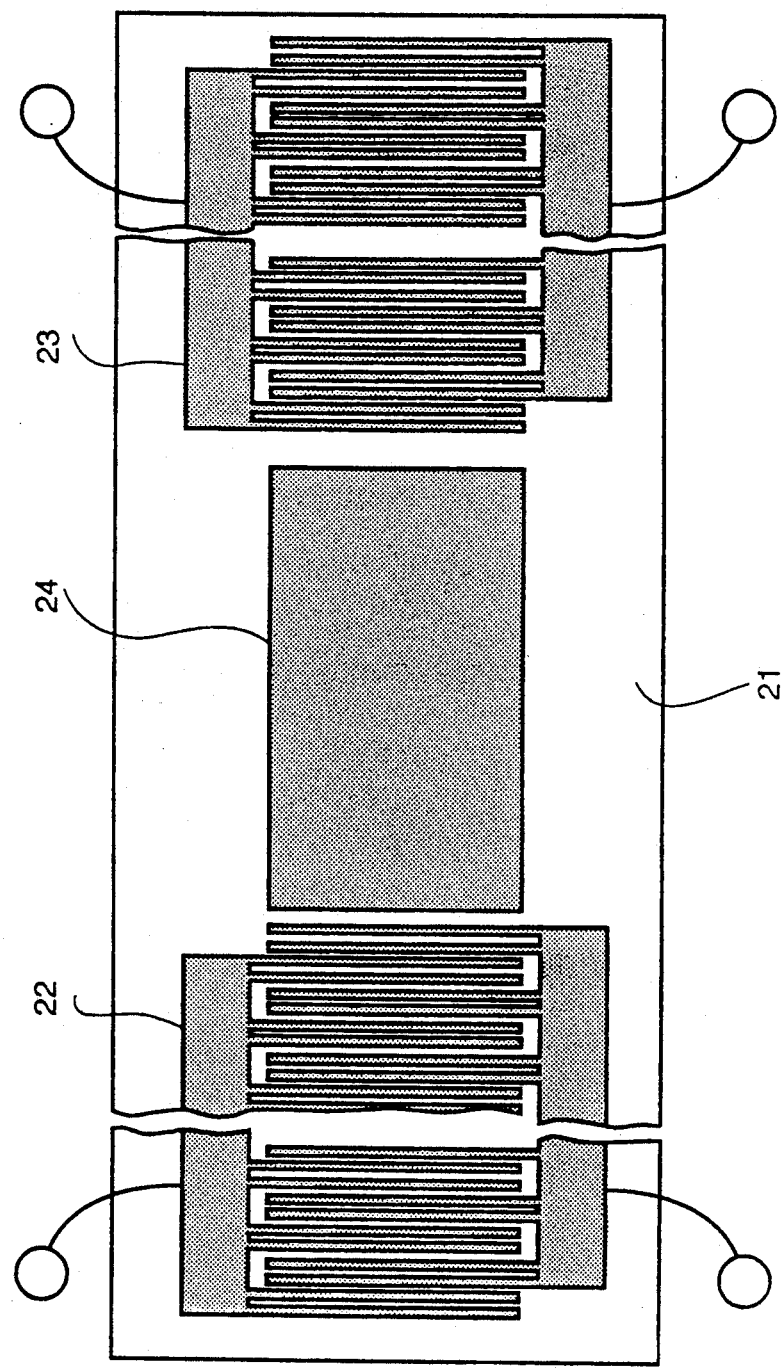
FIG. 24 is a view of the surface acoustic wave device according to a first embodiment of the present invention.

As shown in FIG. 24, the surface acoustic wave device according to the first example is a transversal type delay line which comprises input interdigital transducer 22 and output interdigital transducer 23 respectively including double electrode interdigital transducer (the width of a finger electrode is $\lambda/8$) formed on a piezoelectric substrate 21 of lithium tetraborate single crystal having plane (110) on the surface, and metal films 24 formed in propagation path regions between the respective input interdigital transducer 22 and their adjacent output interdigital transducer 23. The input interdigital transducer 22 and the output interdigital transducer 23 are provided in twenty pairs. The electrodes have a 40 μm-period (5 μm-electrode line width), a 2000 μm-aperture, and a propagation direction of the surface acoustic wave represented by an Eulerian angle (45°, 90°, 0°). The electrodes 22, 23, and the metal films 24 are formed of gold (Au).

Figure 25:
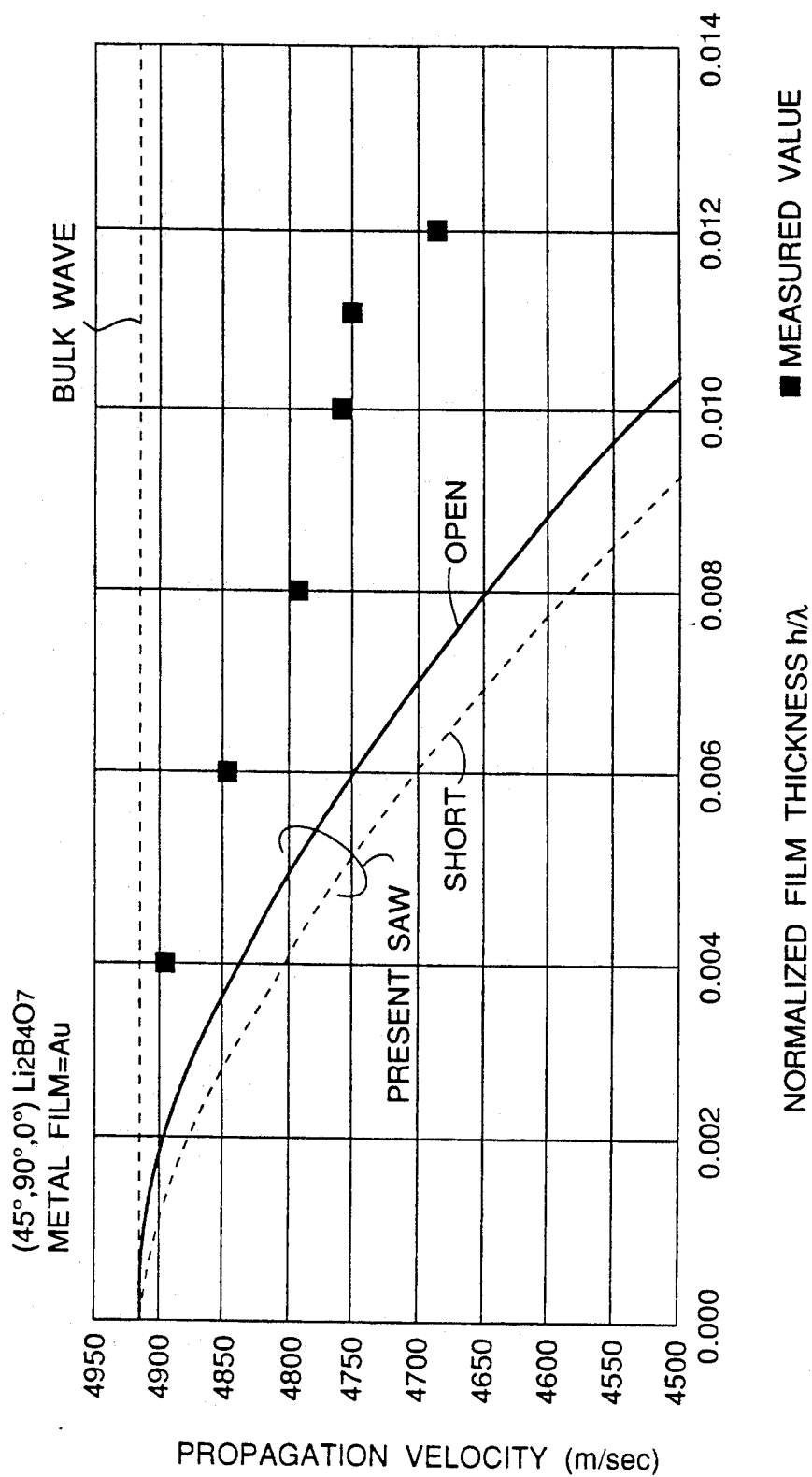
FIG. 25 is a graph of the measured propagation velocity with the normalized film thickness of the metal film varied in the surface acoustic wave device according to the first embodiment of the present invention.
Figure 26:
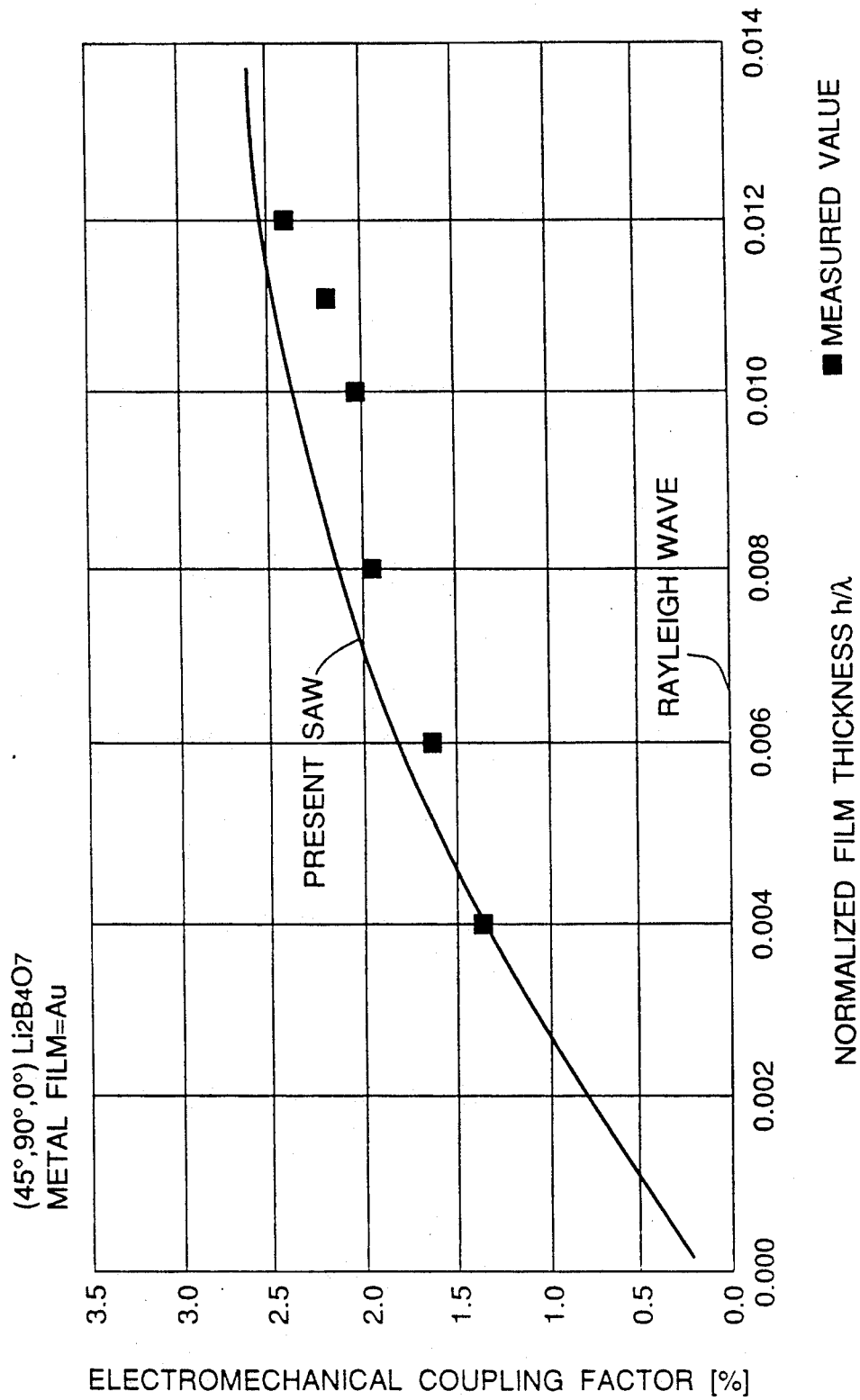
FIG. 26 is a graph of the measured electromechanical coupling factor with the normalized film thickness of the metal film varied in the surface acoustic wave device according to the first embodiment of the present invention.

FIGS. 25 and 26 show the measured results of the propagation velocity [m/sec] and the electromechanical coupling factor [%] obtained when the thickness of the input interdigital transducer 22, the output interdigital transducer 23 and the metal film 24 was varied. The measurement was made at 0.4–1.2% of the normalized film thickness $h/\lambda$ which is given by dividing a film thickness h of the electrodes 22, 23 and the metal film 24 by a wave length $\lambda$ of the surface acoustic wave. The resultant surface acoustic wave device had an electromechanical coupling factor as high as about 2% and a propagation velocity so high as about 4800 m/sec at, e.g., 0.8% of the normalized film thickness $h/\lambda$. With the electrode line width of the input interdigital transducer 22 and the output interdigital transducer 23 set at 0.5 μm, the surface acoustic wave device according to this example is applicable to high-frequency signals of even 2.4 GHz.

As seen in FIGS. 25 and 26, the measured results show that a surface acoustic wave device having an electromechanical factor of above 1.3%, and a propagation velocity of above about 4700 m/sec in a normalized film thickness $h/\lambda$ range of 0.4 to 1.2%.

This experimental results well agree with the simulation results.

2.2 A Second Example

The surface acoustic wave device according to a second example of the present invention will be explained with reference to FIGS. 27 and 28.

The surface acoustic wave device according to the second example is a transversal type delay line, as is the surface acoustic wave device according to the first example, which comprises input interdigital transducer 22, output interdigital transducer 23 and a metal film 24 formed on a piezoelectric substrate 21 of lithium tetraborate single crystal having plane (110) on the surface.

The propagation direction of the surface acoustic wave is indicated by an Eulerian angle representation (45°, 90°, 0°). This example is different from the first example in that in the former the electrodes 22, 23 and the metal film 24 are formed of aluminium.

Figure 27:
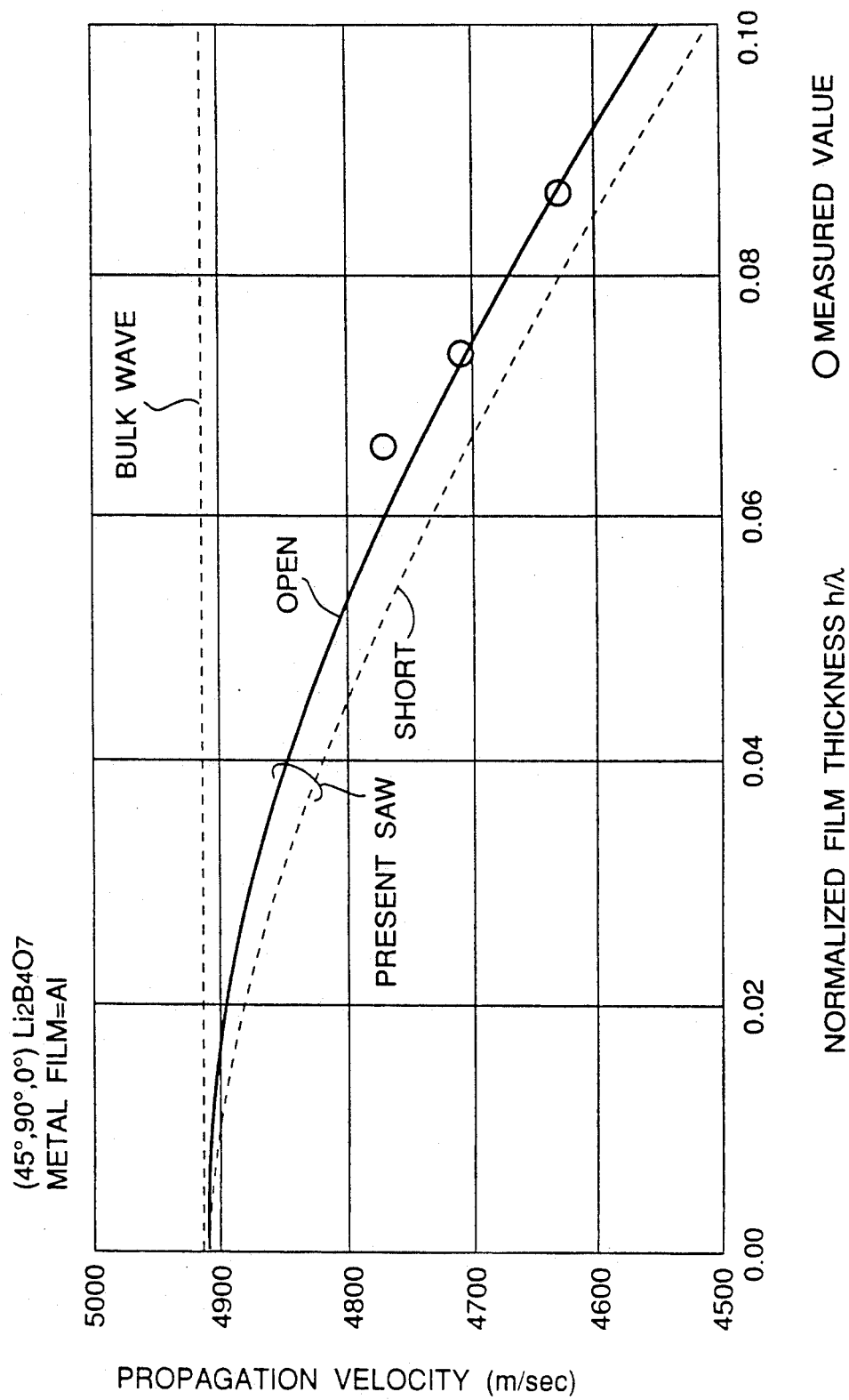
FIG. 27 is a graph of the measured propagation velocity with the normalized film thickness of the metal film varied in the surface acoustic wave device according to a second embodiment of the present invention.
Figure 28:
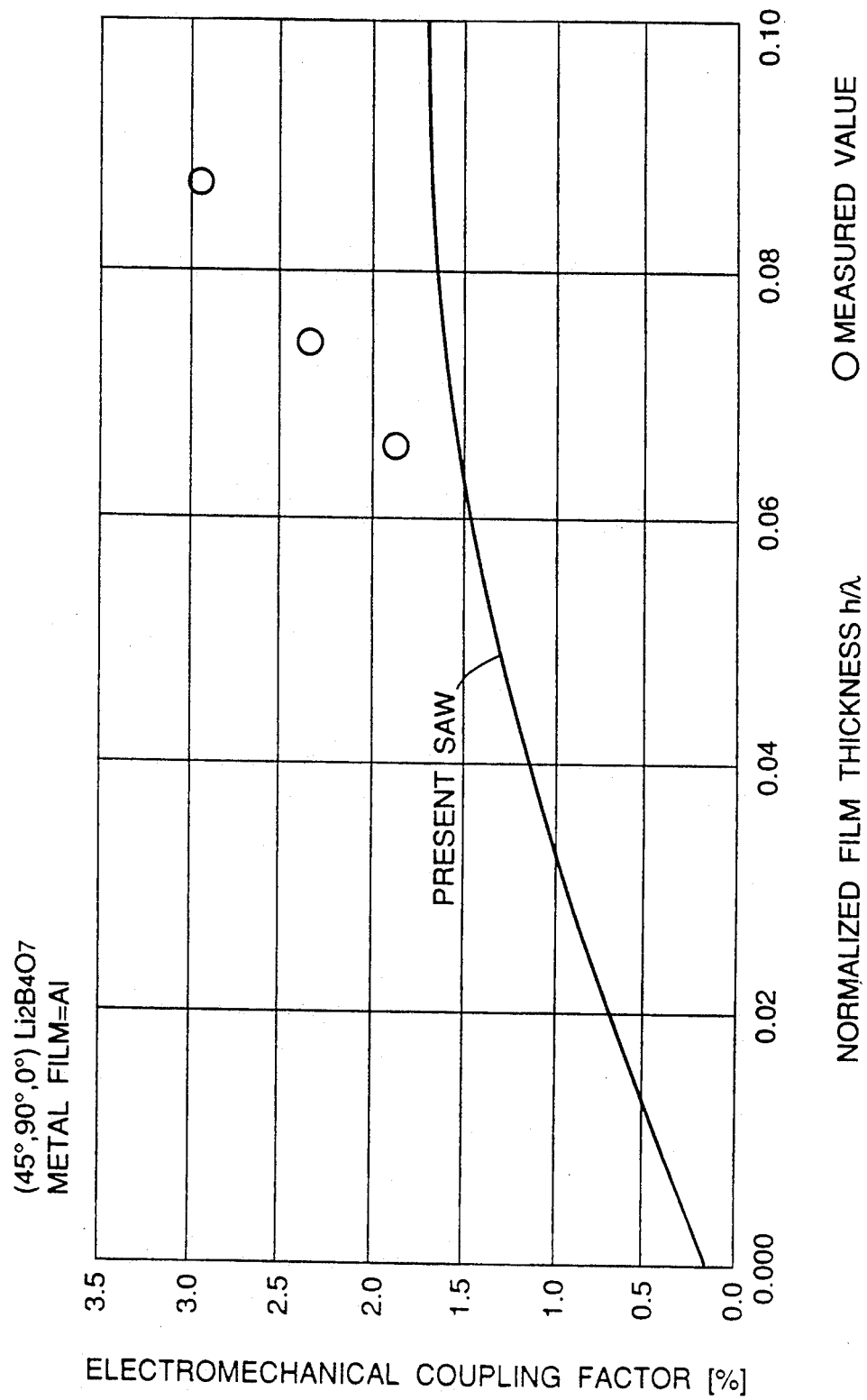
FIG. 28 is a graph of the measured electromechanical coupling factor with the normalized film thickness of the metal film varied in the surface acoustic wave device according to the second embodiment of the present invention.

FIGS. 27 and 28 show measured results of the propagation velocity [m/sec] and electromechanical coupling factor [%] obtained when a thickness of the metal film 24 is varied. The measurement was made at about 6-9% of the normalized film thickness h/λ which is given by dividing a film thickness h of the electrodes 22, 23 and the metal film 23 by a wave length λ of the surface acoustic wave. The resultant surface acoustic wave device had an electromechanical coupling factor as high as about 2.5% and a propagation velocity so high as about 4700 m/sec at, e.g., about 7% of the normalized film thickness h/λ. With the electrode line width of the input interdigital transducer 22 and the output interdigital transducer 23 set at 0.5 μm, the surface acoustic wave device according to this example is applicable to high-frequency signals of even 2.35 GHz.

As seen in FIGS. 27 and 28, the measured results show that a surface acoustic wave device having a electromechanical factor of above bout 2.0%, and a propagation velocity of above about 4600 m/sec in a normalized film thickness h/λ range of about 6 to 9%.

This experimental results well agree with the simulation results.

2.3 A Third Example

The surface acoustic wave device according to a third example of the present invention will be explained with reference to FIGS. 29 to 31.

Figure 29A:
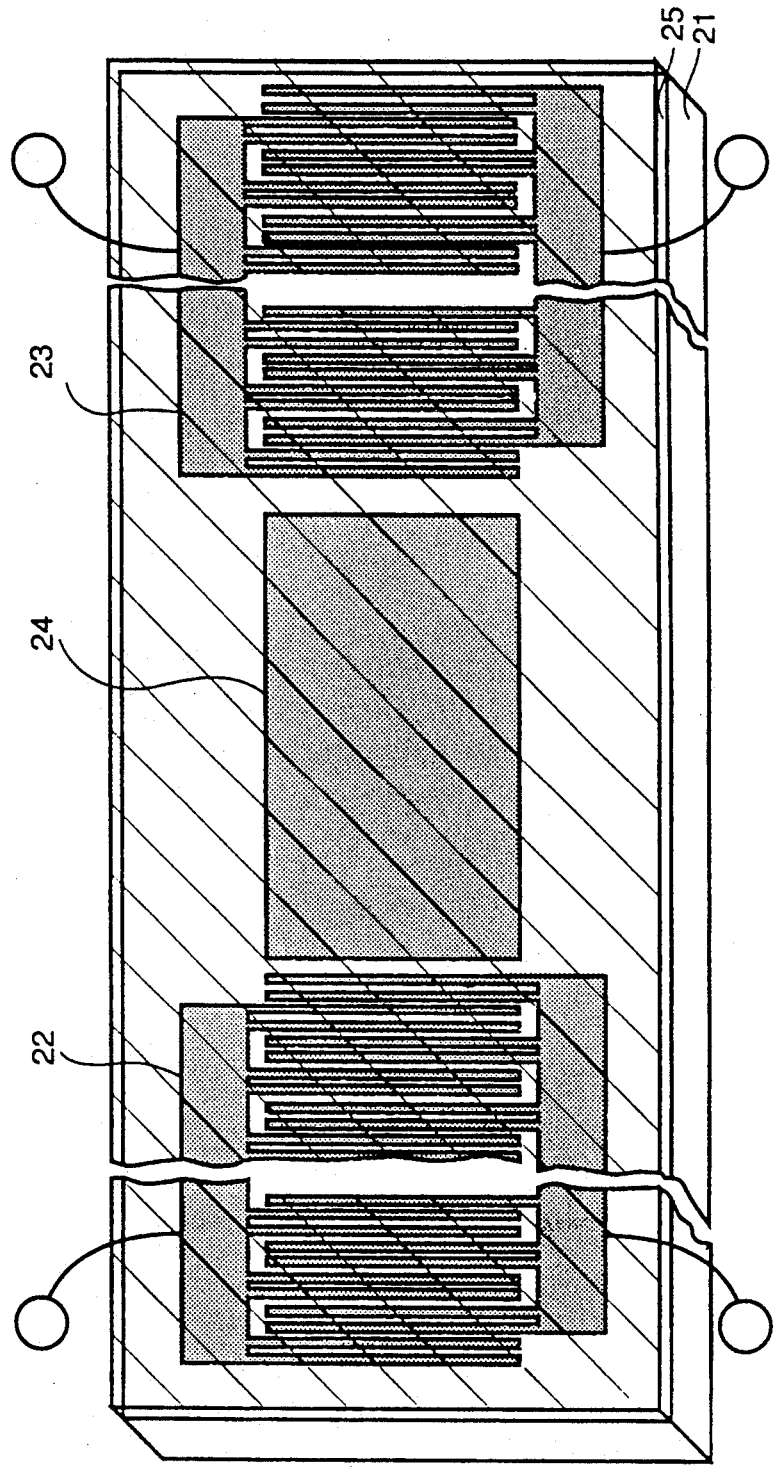
FIGS. 29A and 29B are views of the surface acoustic wave device according to a third embodiment of the present invention.
Figure 29B:
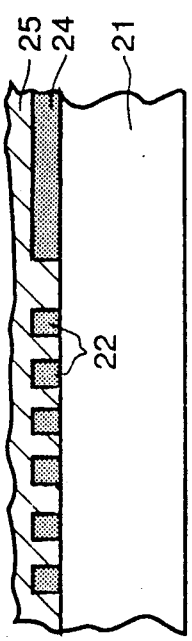

FIG. 29A is a top perspective view of the surface acoustic wave device according to the third example. FIG. 29B is a sectional view of a major part of the surface acoustic wave device according to the third example. As shown in FIG. 29, the surface acoustic wave device according to the first example is a transversal type delay line which comprises input interdigital transducer 22 and output interdigital transducer 23 respectively including double interdigital transducer formed on a piezoelectric substrate 21 of lithium tetraborate single crystal having plane (110) on the surface, metal films 24 formed in propagation path regions between the respective input interdigital transducer 22 and their adjacent output interdigital transducer 23, and an insulating film 25 formed on the entire surface.

The input interdigital transducer 22 and the output interdigital transducer 23 are provided in twenty pairs. The electrodes have an 8 μm-period (1 μm-electrode line width), a 400 μm-aperture, and a propagation direction of the surface acoustic wave indicated by an Eulerian angle representation (45°, 90°, 0°). The electrodes 22, 23, and the metal films 24 are formed of aluminum (Al) and have a 80 nm-thickness (1.0%-normalized film thickness). The insulating film is formed of silicon dioxide.

Figure 30A:
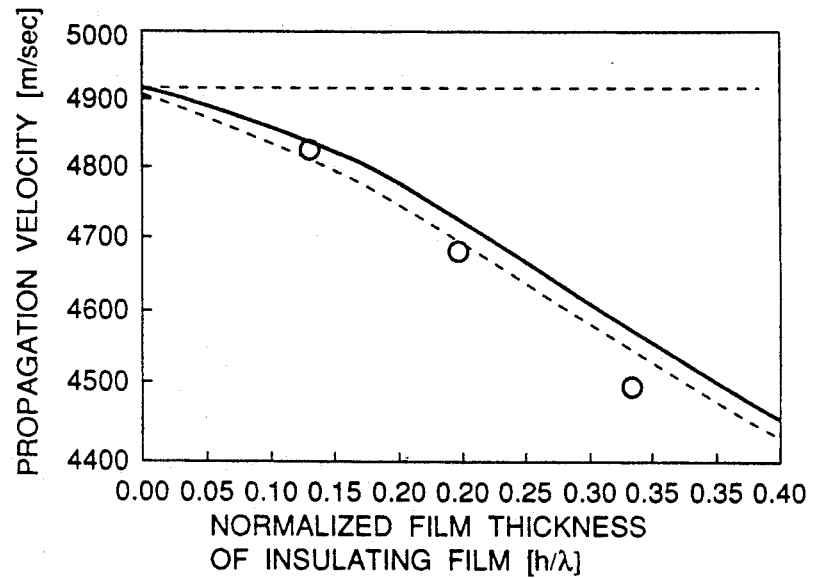
FIGS. 30A and 30B are graphs of the measured propagation velocity and electromechanical coupling factor with the normalized film thickness of the insulating film in the surface acoustic wave device according to the third embodiment of the present invention.
Figure 30B:
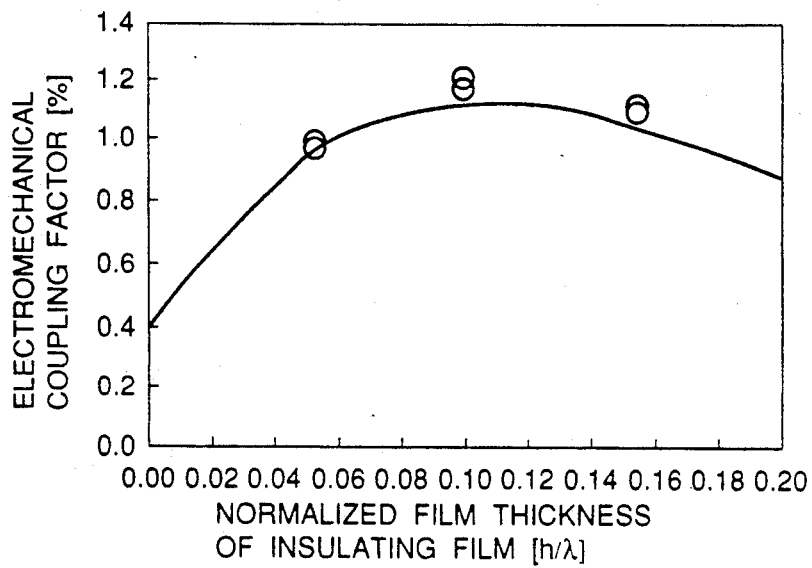
Figure 31:
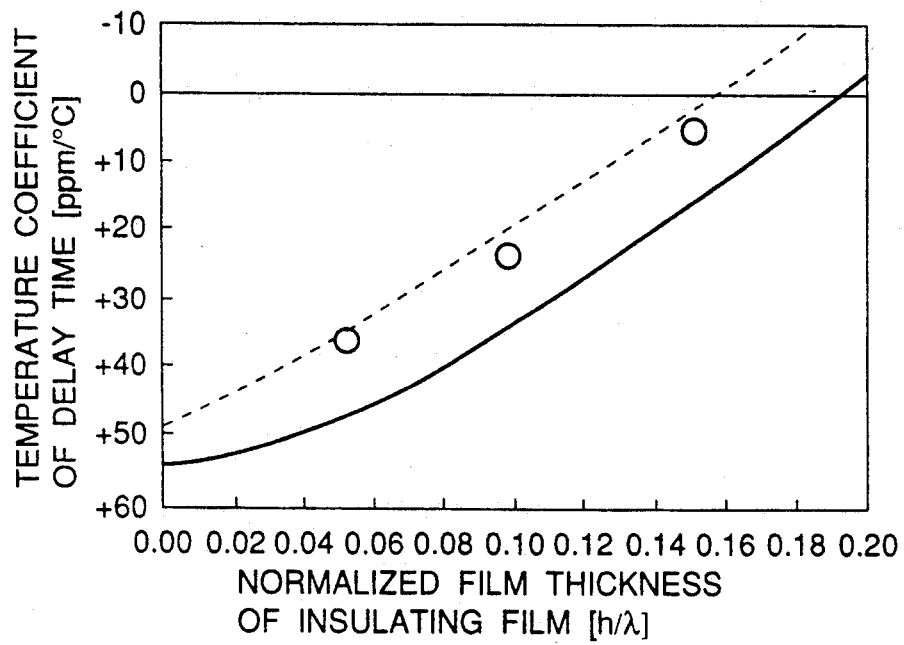
FIG. 31 is a graph of the measured temperature coefficient of the delay time with the normalized film thickness of the insulating film in the surface acoustic wave device according to the third embodiment of the present invention.

FIGS. 30 and 31 show the measured results and simulated results of the propagation velocity, electromechanical coupling factor, and the temperature characteristic of delay times.

FIGS. 30A and 30B show the measured results of the propagation velocity [m/sec] and the electromechanical coupling factor [%] of the present SAW. FIG. 31 shows the measured results of the temperature coefficient of delay times [ppm/°C.] of the present SAW.

In this measurement, the propagation velocity was measured based on center frequencies of the frequency response, the electromechanical coupling factor was measured based on radiation admittances of the interdigital transducer 22, 23, and the temperature coefficient was measured based on temperature characteristics of the phases of the frequency response.

As shown in FIGS. 30 and 31, these measured results well agree with the simulated results. The resultant surface acoustic wave device had a propagation velocity as high as 4500 m/sec, an electromechanical coupling factor as high as 1.2% and a temperature coefficient as small as about +5 ppm/°C. when the normalized film thickness given by dividing a film thickness of the insulating film 25 by a wave length is 15%.

2.4 Other Examples

The present invention is not limited to the above-described examples and includes variations.

For example, in the above-described examples, the metal film is formed of aluminium or gold, but instead, it is possible that a metal thin film is formed of titanium, tungsten, molybdenum, aluminium or others on the surface of a piezoelectric substrate, and a metal film of an alloy of aluminium or gold as the main component. The adhesion of the metal film to the piezoelectric substrate can be improved. Silicon, copper or others sometimes added by some percentage to the aluminium or gold.

The above-described examples have been explained by means of delay lines and surface acoustic wave filters, but the present invention is applicable to other surface acoustic wave devices. For example, the present invention is applicable to surface acoustic wave resonator comprising an interdigital electrode formed on a piezoelectric substrate, which is sandwiched by a pair of grating reflectors.

Different from the above-described examples, none of the metal films may be provided on the propagation path of the surface acoustic wave.

In the above-described examples, the piezoelectric substrate is provided by a lithium tetraborate single crystal substrate which has plane (110), but may have, as the principal plane, plane (100), (170), (150), (130), (120), (350), (230), (561), (451), (341), (471), (361), (181), or others.

What is claimed is:

1. A surface acoustic wave device comprising a metal film formed on a surface of a lithium tetraborate single crystal substrate, the metal film being for exciting, receiving, reflecting and/or propagating surface acoustic waves, the metal film being so formed that a cut angle of the substrate, and a propagation direction of the surface acoustic waves are in an Eulerian angle representation of (39°-51°, 66°-114°, −20°-20°) and directions equivalent thereto.

2. A surface acoustic wave device comprising a metal film formed on a surface of a lithium tetraborate single crystal substrate, the metal film being for exciting, receiving, reflecting and/or propagating surface acoustic waves, the metal film being formed of a metal comprising gold as a main component, the metal film having a normalized film thickness of 0.01-4.5%, the metal film being so formed that a cut angle of the substrate, and a propagation direction of the surface acoustic waves are in an Eulerian angle representation of (0°-45°, 82°-98°, −2°-2°) and directions equivalent thereto.

3. A surface acoustic wave device comprising a metal film formed on a surface of a lithium tetraborate single crystal substrate, the metal film being for exciting, receiving, reflecting and/or propagating surface acoustic waves,
   the metal film being formed of a metal comprising aluminium as a main component,
   the metal film having a normalized film thickness of 0.1- 35%,
   the metal film being so formed that a cut angle of the substrate, and a propagation direction of the surface acoustic wave are in an Eulerian angle representation of (0°-45°, 82°-98°, −2°-2°) and direction equivalent thereto.

4. A surface acoustic wave device according to claim 1, wherein the metal film is formed of a metal comprising gold as a main component, and the metal film has a normalized film thickness of 0.01-4.5%.

5. A surface acoustic wave device according to claim 1, wherein the metal film is formed of a metal comprising aluminium as a main component, and the metal film has a normalized film thickness of 0.1-35%.

6. A surface acoustic wave device according to claim 2, wherein the metal film has a normalized film thickness of 0.2-1.5%.

7. A surface acoustic wave device according to claim 4, wherein the metal film has a normalized film thickness of 0.2-1.5%.

8. A surface acoustic wave device according to claim 3, wherein the metal film has a normalized film thickness of 2-15%.

9. A surface acoustic wave device according to claim 5, wherein the metal film has a normalized film thickness of 2-15%.

10. A surface acoustic wave device according to claim 4, wherein
    the metal film is so formed that a cut angle of the substrate, and the propagation direction of the surface acoustic wave are in an Eulerian angle representation of (44°-46°, 89°-91°, −1°-1°) and direction equivalent thereto.

11. A surface acoustic wave device according to claim 5, wherein
    the metal film is so formed that a cut angle of the substrate, and the propagation direction of the surface acoustic wave are in an Eulerian angle representation of (44°-46°, 89°-91°, −1°-1°) and direction equivalent thereto.

12. A surface acoustic wave device according to claim 1, wherein an insulating film is formed on the lithium tetraborate single crystal substrate and the metal film.

13. A surface acoustic wave device according to claim 2, wherein an insulating film is formed on the lithium tetraborate single crystal substrate and the metal film.

14. A surface acoustic wave device according to claim 3, wherein an insulating film is formed on the lithium tetraborate single crystal substrate and the metal film.

15. A surface acoustic wave device according to claim 12, wherein the insulating film is formed of silicon dioxide.

16. A surface acoustic wave device according to claim 13, wherein the insulating film is formed of silicon dioxide.

17. A surface acoustic wave device according to claim 14, wherein the insulating film is formed of silicon dioxide.

18. A surface acoustic wave device according to claim 15, wherein the insulating film has a normalized film thickness of 1-35%.

19. A surface acoustic wave device according to claim 16, wherein the insulating film has a normalized film thickness of 1-35%.

20. A surface acoustic wave device according to claim 17, wherein the insulating film has a normalized film thickness of 1-35%.

* * * * *